US012804883B2

(12) United States Patent
Tang

(10) Patent No.: US 12,804,883 B2
(45) Date of Patent: Nov. 17, 2026

(54) MANAGING VERTICAL STRUCTURES IN THREE-DIMENSIONAL SEMICONDUCTIVE DEVICES

(71) Applicant: Yangtze Memory Technologies Co., Ltd., Wuhan (CN)

(72) Inventor: Zhaoyun Tang, Wuhan (CN)

(73) Assignee: Yangtze Memory Technologies Co., Ltd., Wuhan (CN)

(*) Notice: Subject to any disclaimer, the term of this patent is extended or adjusted under 35 U.S.C. 154(b) by 397 days.

(21) Appl. No.: 18/477,503

(22) Filed: Sep. 28, 2023

(65) Prior Publication Data

US 2025/0063723 A1 Feb. 20, 2025

Related U.S. Application Data

(63) Continuation of application No. PCT/CN2023/113723, filed on Aug. 18, 2023.

(51) Int. Cl.
*H10B 12/00* (2023.01)

(52) U.S. Cl.
CPC ......... *H10B 12/395* (2023.02); *H10B 12/053* (2023.02); *H10B 12/315* (2023.02); *H10B 12/482* (2023.02)

(58) Field of Classification Search
CPC .. H10B 12/395; H10B 12/053; H10B 12/315; H10B 12/482; H10B 12/488; H10B 12/05
See application file for complete search history.

(56) References Cited

U.S. PATENT DOCUMENTS

| | | | |
|---|---|---|---|
| 11,069,596 | B2 | 7/2021 | Chen et al. |
| 2003/0232470 | A1 | 12/2003 | Manger et al. |

(Continued)

FOREIGN PATENT DOCUMENTS

| | | | |
|---|---|---|---|
| CN | 1917212 | A | 2/2007 |
| CN | 110880474 | A | 3/2020 |

(Continued)

OTHER PUBLICATIONS

Office Action in Chinese Appln. No. 202380010838.6, mailed on Aug. 30, 2025, 20 pages (with English translation).

(Continued)

*Primary Examiner* — Jonathan Han
(74) *Attorney, Agent, or Firm* — Hanley, Flight & Zimmerman, LLC

(57) ABSTRACT

Systems, devices, and methods for managing vertical structures in three-dimensional (3D) semiconductor devices are provided. In one aspect, a method includes: providing a semiconductor substrate, and forming isolating regions between a plurality of adjacent vertical transistors in the semiconductor substrate. Each vertical transistor of the plurality of adjacent vertical transistors extends along a vertical direction. Two adjacent vertical transistors and a corresponding isolating region between the two adjacent vertical transistors are positioned along a horizontal direction perpendicular to the vertical direction. The corresponding isolating region includes a conductive material, and, along the vertical direction, a length of the conductive material in the corresponding isolating region is greater than a length of a vertical gate of each of the two adjacent vertical transistors.

20 Claims, 15 Drawing Sheets

(56) References Cited

U.S. PATENT DOCUMENTS

| | | | | |
|---|---|---|---|---|
| 2005/0077568 | A1 | 4/2005 | Park et al. | |
| 2012/0091519 | A1 | 4/2012 | Tu | |
| 2013/0234240 | A1 | 9/2013 | Moon et al. | |
| 2021/0005611 | A1* | 1/2021 | Sukekawa ............ | H10B 12/315 |
| 2021/0296210 | A1 | 9/2021 | Chen et al. | |
| 2021/0391337 | A1 | 12/2021 | Pandey et al. | |
| 2022/0045094 | A1 | 2/2022 | Lee et al. | |
| 2022/0084955 | A1 | 3/2022 | Liu et al. | |
| 2023/0062141 | A1 | 3/2023 | Zhu et al. | |
| 2023/0245980 | A1 | 8/2023 | Sun et al. | |

FOREIGN PATENT DOCUMENTS

| | | | |
|---|---|---|---|
| CN | 112930600 | A | 6/2021 |
| CN | 113711353 | A | 11/2021 |
| CN | 116097438 | A | 5/2023 |
| KR | 20230003169 | A | 1/2023 |

OTHER PUBLICATIONS

International Search Report in International Appln. No. PCT/CN2023/113723, mailed on Feb. 5, 2024, 3 pages.
Office Action in Chinese Appln. No. 202380010838.6, mailed on Jan. 20, 2026, 18 pages (with English translation).
Notice of Allowance in Chinese Appln. No. 202380010838.6, mailed on Mar. 31, 2026, 6 pages (with machine translation).
Office Action in Korean Appln. No. 10-2025-7028755, mailed on Jul. 22, 2026, 14 pages (with English translation).

* cited by examiner

MANAGING VERTICAL STRUCTURES IN THREE-DIMENSIONAL SEMICONDUCTIVE DEVICES

CROSS-REFERENCE TO RELATED APPLICATIONS

This application is a continuation of International Application No. PCT/CN2023/113723, filed on Aug. 18, 2023, the disclosure of which is hereby incorporated by reference in its entirety.

TECHNICAL FIELD

The present disclosure relates to semiconductor devices and fabrication processes for semiconductor devices.

BACKGROUND

Semiconductor devices, e.g., memory devices, can have various structures to increase a density of memory cells and lines on a chip. For example, three-dimensional (3D) memory devices are attractive due to their capability to increase an array density by stacking more layers within a similar footprint. A 3D memory device normally includes a memory array of memory cells and peripheral circuits for facilitating operations of the memory array. The memory cells can include vertical structures, e.g., vertical transistors.

SUMMARY

The present disclosure describes methods, devices, systems and techniques for managing vertical structures in three-dimensional (3D) semiconductor devices.

One aspect of the present disclosure features a method including: providing a semiconductor substrate and forming isolating regions between a plurality of adjacent vertical transistors in the semiconductor substrate. Each vertical transistor of the plurality of adjacent vertical transistors extends along a vertical direction, and two adjacent vertical transistors and a corresponding isolating region between the two adjacent vertical transistors are positioned along a horizontal direction perpendicular to the vertical direction. The corresponding isolating region includes a conductive material, and along the vertical direction, a length of the conductive material in the corresponding isolating region is greater than a length of a vertical gate of each of the two adjacent vertical transistors.

In some implementations, forming the isolating regions between the plurality of adjacent vertical transistors in the semiconductor substrate includes: forming a plurality of trenches in the semiconductor substrate, the plurality of trenches being positioned along the horizontal direction, each of the plurality of trenches extending along the vertical direction; and forming the corresponding isolating region by depositing the conductive material in a middle trench between two adjacent trenches for forming the two adjacent vertical transistors.

In some implementations, the method further includes: forming the two adjacent vertical transistors by depositing an isolating material in the two adjacent trenches and then depositing at least one conductive layer on the deposited isolating material in the two adjacent trenches to form the vertical gates of the two adjacent vertical transistors. Along the vertical direction, a length of the deposited at least one conductive layer in each of the two adjacent trenches is smaller than the length of the conductive material filled in the middle trench.

In some implementations, the semiconductor substrate includes a first side and a second side opposite to the first side. Forming the isolating regions between the adjacent vertical transistors in the semiconductor substrate includes forming the isolating regions between the adjacent vertical transistors in the semiconductor substrate from the first side of the semiconductor substrate. In some implementations, the method further includes: etching the semiconductor substrate from the second side of the semiconductor substrate to expose the conductive material in the corresponding isolating region, without exposing the vertical gates of the two adjacent vertical transistors.

In some implementations, etching the semiconductor substrate from the second side of the semiconductor substrate includes: etching the semiconductor substrate in an etching region from a surface of the semiconductor substrate along the vertical direction. The etching region has a bottom edge and an etching depth from the surface of the semiconductor substrate to the bottom edge. Along the vertical direction, the etching depth is greater than a first distance between the surface of the semiconductor substrate and an end of the conductive material filled in the middle trench and smaller than a second distance between the surface of the semiconductor substrate and an end of the deposited at least one conductive layer in each of the two adjacent trenches. In some implementations, the etching region has two opposite edges within the two adjacent trenches along the horizontal direction.

In some implementations, the method further includes: forming a corresponding conductive interconnection in contact with the exposed conductive material in the corresponding isolating region in the second side of the semiconductor substrate. In some implementations, the method further includes: forming a plurality of bit lines from the second side of the semiconductor substrate.

In some implementations, the method includes: depositing the isolating material to fill a portion of each of the plurality of trenches along the vertical direction; patterning photoresist to cover the two adjacent trenches and to expose the middle trench; etching the deposited isolating material in the middle trench; depositing the conductive material in the middle trench to form the corresponding isolating region; and removing the photoresist and depositing the at least one conductive layer on the deposited isolating material in the two adjacent trenches to form the vertical gates of the two adjacent vertical transistors.

In some implementations, the method includes: for each of the two adjacent trenches, cutting the deposited at least one conductive layer in the trench to form two separate vertical gates of a pair of independent vertical transistors in the trench.

In some implementations, the method further includes: forming an array structure in a first region, the array structure including a plurality of strings of memory cells, each memory cell of the plurality of strings of memory cells including a respective vertical transistor. The isolating regions and the plurality of adjacent vertical transistors in the semiconductor substrate are formed in a second region adjacent to the first region.

In some implementations, forming the array structure includes: forming the respective vertical transistors of the plurality of strings of memory cells by depositing the at least one conductive layer in corresponding trenches. Along the vertical direction, a length of the deposited at least one conductive layer in the corresponding trenches in the first region is greater than the length of the vertical gate of each of the two adjacent vertical transistors in the second region.

In some implementations, the method includes: depositing the isolating material to fill a part of each of the two adjacent trenches for the two adjacent vertical transistors in the second region and the corresponding trenches for the memory cells in the first region along the vertical direction; patterning photoresist to cover the two adjacent trenches and to expose the corresponding trenches; etching the deposited isolating material in the corresponding trenches; removing the photoresist to expose the two adjacent trenches; and depositing the at least one conductive layer on the deposited isolating material in the two adjacent trenches to form the vertical gates of the two adjacent vertical transistors and in the corresponding trenches to form the vertical transistors for the memory cells.

Another aspect of the present disclosure features a semiconductor device, including: a semiconductor substrate, a plurality of vertical transistors positioned in the semiconductor substrate along a horizontal direction, each of the plurality of vertical transistors extending along a vertical direction perpendicular to the horizontal direction, and a plurality of isolating regions in the semiconductor substrate, each of the plurality of isolating regions being between two adjacent vertical transistors of the plurality of vertical transistors along the horizontal direction. The isolating region includes a conductive material, and, along the vertical direction, a length of the conductive material in the isolating region is greater than a length of a vertical gate of each of the two adjacent vertical transistors.

In some implementations, the isolating region includes the conductive material filled in a middle trench between two adjacent trenches corresponding to the two adjacent vertical transistors. The vertical gate of each of the two adjacent vertical transistors includes at least one conductive layer on an isolating material filled in a portion of a respective trench of the two adjacent trenches. Along the vertical direction, a length of the at least one conductive layer in each of the two adjacent trenches is smaller than the length of the conductive material filled in the middle trench.

In some implementations, the semiconductor substrate includes first and second opposite sides. The plurality of isolating regions and the plurality of vertical transistors are in the first side of the semiconductor substrate. The semiconductor device further includes conductive interconnections formed in the second side of the semiconductor substrate. Each of the conductive interconnections is in contact with the conductive material in a corresponding isolating region of the plurality of isolating regions and has an end higher than an end of the at least one conductive layer in each of the two adjacent trenches from the second side of the semiconductor substrate along the vertical direction.

In some implementations, the semiconductor device further includes a plurality of bit lines in the second side of the semiconductor substrate, each of the plurality of bit lines being coupled to corresponding vertical transistors. In some implementations, in each of the two adjacent trenches, two vertical gates of a pair of independent vertical transistors are separated by an isolating material filled in the trench.

In some implementations, the semiconductor device further includes an array structure in a first region, the array structure including a plurality of strings of each memory cell of the plurality of strings of memory cells including a vertical transistor having a vertical gate. The plurality of isolating regions and the plurality of vertical transistors are formed in a second region of the semiconductor substrate that is adjacent to the first region along a third direction perpendicular to the vertical direction and the horizontal direction.

In some implementations, along the vertical direction, a length of the vertical gate of the vertical transistor of the memory cell in the first region is greater than the length of the vertical gate of each of the two adjacent vertical transistors in the second region. In some implementations, the length of the vertical transistor of the memory cell in the first region is greater than the length of the conductive material in the isolating region in the second region.

In some implementations, along the third direction, the vertical gate of the vertical transistor of the memory cell in the first region is in direct contact with a first isolating layer, while the vertical gate of each of the two adjacent vertical transistors in the second region is separated from a second isolating layer by a passivation layer.

A further aspect of the present disclosure features a system including: a memory device and a controller coupled to the memory device and configured to control the memory device. The memory device includes: a semiconductor substrate, a plurality of vertical transistors positioned in the semiconductor substrate along a horizontal direction, each of the plurality of vertical transistors extending along a vertical direction perpendicular to the horizontal direction, and a plurality of isolating regions in the semiconductor substrate. Each of the plurality of isolating regions is between two adjacent vertical transistors along the horizontal direction. The isolating region includes a conductive material, and, along the vertical direction, a length of the conductive material in the isolating region is greater than a length of a vertical gate of each of the two adjacent vertical transistors.

In some implementations, the isolating region includes the conductive material filled in a middle trench between two adjacent trenches corresponding to the two adjacent vertical transistors. The vertical gate of each of the two adjacent vertical transistors includes at least one conductive layer on an isolating material filled in a part of a respective trench of the two adjacent trenches, and, along the vertical direction, a length of the at least one conductive layer in each of the two adjacent trenches is smaller than the length of the conductive material filled in the middle trench.

Implementations of the present disclosure can provide one or more of the following technical advantages and/or benefits. For example, multiple trenches can be formed in a semiconductor substrate. An isolating material (e.g., oxide) can be filled in a bottom portion of a trench in a connection region and vertical gates can be formed on the filled isolating material in the trench, which can control a depth of the vertical gates or a cutting depth of the vertical gates and accordingly better control a process window for a gate cutting process. Additionally, an isolating region in a middle trench between adjacent trenches for forming the vertical gates can include a conductive material (e.g., metal) filled in the middle trench, without isolating material in a bottom portion of the middle trench. Thus, the semiconductor substrate can be etched from a back side to expose the conductive material in the isolating region, without exposing the vertical gates in the adjacent trenches, during which the deposited isolating material in the adjacent trenches functions as a stop layer. Similarly, each conductive layer (e.g., metal) for forming vertical gates of memory cells can be also exposed and cut from the back side of the semiconductor substrate into two separate pieces as the vertical gates of the memory cells. By etching together the conductive material in the isolating region and the conductive layer for forming the vertical gates of the memory cells in the array region, the techniques enable to reduce fabrication cost and fabrication difficulty, eliminate issues or risks due to metal punch from a front side of the semiconductor substrate (e.g., hard to control due to line wiggling), and optimize the fabrication process (e.g., omit one or more processing operations such as high cost oxide recess operation). The techniques also enable to control a region for coupling out from the back side of the 3D semiconductor structure, which can enlarge a processing window and simplify or optimize the fabrication process of a 3D semiconductor device and reduce the fabrication cost.

The techniques can be applied to various types of semiconductor devices, volatile memory devices, such as DRAM memory devices, or non-volatile memory (NVM) devices, such as NAND flash memory, NOR flash memory, resistive random-access memory (RRAM), phase-change memory (PCM) such as phase-change random-access memory (PCRAM), spin-transfer torque (STT)-Magnetoresistive random-access memory (MRAM), among others. The techniques can also be applied to charge-trapping based memory devices, e.g., silicon-oxide-nitride-oxide-silicon (SONOS) memory devices, and floating-gate based memory devices. The techniques can be applied to three-dimensional (3D) memory devices. The techniques can be applied to various memory types, such as SLC (single-level cell) devices, MLC (multi-level cell) devices like 2-level cell devices, TLC (triple-level cell) devices, QLC (quad-level cell) devices, or PLC (penta-level cell) devices. Additionally or alternatively, the techniques can be applied to various types of devices and systems, such as secure digital (SD) cards, embedded multimedia cards (eMMC), or solid-state drives (SSDs), embedded systems, among others.

The details of one or more implementations of the subject matter of this present disclosure are set forth in the accompanying drawings and the description below. Other features, aspects, and advantages of the subject matter will become apparent from the description, the drawings, and the claims.

BRIEF DESCRIPTION OF THE DRAWINGS

The accompanying drawings, which are incorporated herein and form a part of the present disclosure, illustrate aspects of the present disclosure and, together with the description, further serve to explain the principles of the present disclosure and to enable a person of ordinary skill in the pertinent art to make and use the present disclosure.

Like reference numbers and designations in the various drawings indicate like elements. It is also to be understood that the various exemplary implementations shown in the figures are merely illustrative representations and are not necessarily drawn to scale.

DETAILED DESCRIPTION

Figure 1:
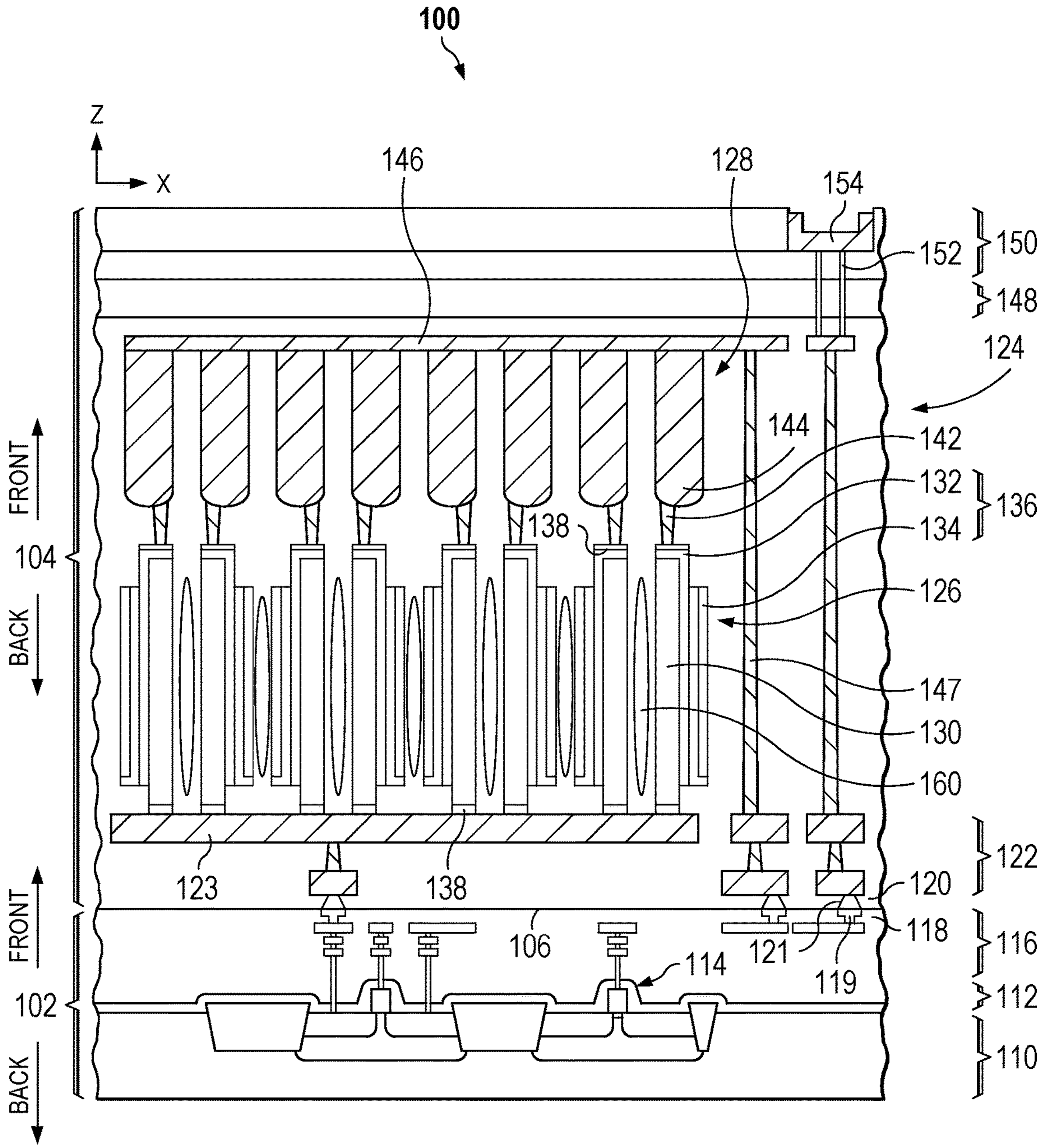
FIG. 1 illustrates a cross-sectional view of an example 3D semiconductor device.

FIG. 1 illustrates a side view of a cross-section of an example 3D semiconductor device 100. The 3D semiconductor device 100 can be a 3D dynamic random-access memory (DRAM). It is understood that FIG. 1 is for illustrative purposes only and may not necessarily reflect the actual device structure (e.g., interconnections) in practice. In some implementations, the 3D semiconductor device 100 is a bonded chip including a first semiconductor structure 102 and a second semiconductor structure 104 stacked over the first semiconductor structure 102. The first and second semiconductor structures 102 and 104 can be jointed at bonding interface 106 therebetween.

As shown in FIG. 1, the first semiconductor structure 102 can include a substrate 110, which can include silicon (e.g., single crystalline silicon, c-Si), SiGe, GaAs, Ge, SOI, or any other suitable materials. The first semiconductor structure 102 can include peripheral circuits 112 on and/or in the substrate 110. In some implementations, the peripheral circuits 112 include a plurality of transistors 114 (e.g., planar transistors and/or 3D transistors). Trench isolations (e.g., shallow trench isolations (STIs)) and doped regions (e.g., wells, sources, and drains of transistors 114) can be formed on or in the substrate 110 as well. In some examples, the peripheral circuits 112 are formed using complementary metal-oxide-semiconductor (CMOS) technology, and the first semiconductor structure 102 can be also formed on a semiconductor die that can be referred to as a control die or a CMOS die 102.

In some implementations, the first semiconductor structure 102 further includes an interconnect layer 116 above the peripheral circuits 112 to transfer electrical signals to and from the peripheral circuits 112. The interconnect layer 116 can include a plurality of interconnects (also referred to herein as "contacts"), including lateral interconnect lines and VIA contacts. The interconnect layer 116 can further include one or more interlay dielectric (ILD) layers in which the interconnect lines and via contacts can form. That is, the interconnect layer 116 can include interconnect lines and via contacts in multiple ILD layers. In some implementations, peripheral circuits 112 are coupled to one another through the interconnects in the interconnect layer 116. The interconnects in interconnect layer 116 can include conductive materials including, but not limited to, W, Co, Cu, Al, doped silicon, silicides, or any combination thereof. The ILD layers can be formed with dielectric materials including, but not limited to, silicon oxide, silicon nitride, silicon oxynitride, low-k dielectrics, or any combination thereof.

As shown in FIG. 1, the first semiconductor structure 102 has a front side and a back side, and the first semiconductor structure 102 can further include a bonding layer 118 at the back side at the bonding interface 106 and above the interconnect layer 116 and the peripheral circuits 112. The bonding layer 118 can include a plurality of bonding contacts 119 and dielectrics electrically isolating the bonding contacts 119. The bonding contacts 119 can include conductive materials, such as Cu. The remaining area of the bonding layer 118 can be formed with dielectric materials, such as silicon oxide. The bonding contacts 119 and surrounding dielectrics in the bonding layer 118 can be used for hybrid bonding. Similarly, as shown in FIG. 1, the second semiconductor structure 104 can also include a bonding layer 120 at the bonding interface 106 and above the bonding layer 118 of the first semiconductor structure 102. The bonding layer 120 can include a plurality of bonding contacts 121 and dielectrics electrically isolating the bonding contacts 121. The bonding contacts 121 can include conductive materials, such as Cu. The remaining area of the bonding layer 120 can be formed with dielectric materials, such as silicon oxide. The bonding contacts 121 and surrounding dielectrics in the bonding layer 120 can be used for hybrid bonding. The bonding contacts 121 can be in contact with the bonding contacts 119 at the bonding interface 106. In some implementations, the bonding layer 120 includes a dielectric layer opposing memory cells (e.g., DRAM cells) 124 with a bit line 123 positioned between the dielectric layer and the memory cells 124, as shown in FIG. 1. The dielectric layer can include the bonding interface 106 having the bonding contacts 121.

The second semiconductor structure 104 can be bonded on top of the first semiconductor structure 102 in a face-to-face manner at the bonding interface 106. In some implementations, the bonding interface 106 is disposed between the bonding layers 120 and 118 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some implementations, the bonding interface 106 is the place at which bonding layers 120 and 118 are met and bonded. In some examples, the bonding interface 106 can be a layer with a certain thickness that includes the top surface of the bonding layer 118 of the first semiconductor structure 102 and the bottom surface of the bonding layer 120 of the second semiconductor structure 104.

In some implementations, the second semiconductor structure 104 further includes an interconnect layer 122 including bit lines 123 above the bonding layer 120 to transfer electrical signals. The interconnect layer 122 can include a plurality of interconnects, such as mid end of line (MEOL) interconnects and back end of line (BEOL) interconnects. In some implementations, the interconnects in interconnect layer 122 also include local interconnects, such as the bit lines 123 and word line contacts (not shown). The interconnect layer 122 can further include one or more ILD layers in which the interconnect lines and via contacts can form. The interconnects in the interconnect layer 122 can include conductive materials including, but not limited to, W, Co, Cu, Al, doped silicon, silicides, or any combination thereof. The ILD layers can be formed with dielectric materials including, but not limited to, silicon oxide, silicon nitride, silicon oxynitride, low-k dielectrics, or any combination thereof.

In some implementations, the peripheral circuits 112 include a word line driver/row decoder coupled to the word line contacts in the interconnect layer 122 through the bonding contacts 121 and 119 in the bonding layers 120 and 118 and the interconnect layer 116. In some implementations, the peripheral circuits 112 include a bit line driver/column decoder coupled to the bit lines 123 and bit line contacts in the interconnect layer 122 through the bonding contacts 121 and 119 in the bonding layers 120 and 118 and the interconnect layer 116. In some implementations, the bit line 123 is a metal bit line, as opposed to semiconductor bit lines (e.g., doped silicon bit lines). For example, the bit line 123 may include W, Co, Cu, Al, or any other suitable metals having higher conductivities than doped silicon. In some implementations, the bit line contact is an ohmic contact as opposed to a Schottky contact.

In some implementations, the bit line 123 is made of a composite conductive material that can be based on a metallic material (e.g., W, Co, Cu, Al) and a semiconductor material (e.g., Si). For example, the composite conductive material can include metal silicide, e.g., such as WSi, CoSi, CuSi, AlSi, or any other suitable metal silicides having higher conductivities than doped silicon.

In some implementations, the second semiconductor structure 104 includes a DRAM device in which memory cells are provided in the form of an array of DRAM cells 124 above the interconnect layer 122 and the bonding layer 120. That is, the interconnect layer 122 including the bit lines 123 can be disposed between bonding layer 120 and array of DRAM cells 124. A bit line 123 in the interconnect layer 122 can be coupled to a string of DRAM cells 124. In some implementations, the second semiconductor structure 104 is formed on a semiconductor die and can be referred to as array die 104.

In some implementations, a semiconductor device can include multiple array dies (e.g., the array die 104) and a CMOS die (e.g., the CMOS die 102). The multiple array dies and the CMOS die can be stacked and bonded together. The CMOS die can be respectively coupled to each of the multiple array dies, and can respectively drive each of the multiple array dies to operate in the similar manner as the semiconductor device. The semiconductor device can be any suitable device. In some examples, the semiconductor device includes at least a first wafer and a second wafer bonded face to face. The array die can be disposed with other array dies on the first wafer, and the CMOS die can be disposed with other CMOS dies on the second wafer. The first wafer and the second wafer can be bonded together, thus the array dies on the first wafer can be bonded with corresponding CMOS dies on the second wafer. In some examples, the semiconductor device is a chip with at least the array die and the CMOS die bonded together. In an example, the chip is diced from wafers that are bonded together. In another example, the semiconductor device is a semiconductor package that includes one or more semiconductor chips assembled on a package substrate.

Each DRAM cell 124 can include a vertical transistor 126 and a capacitor 128 coupled to the vertical transistor 126. DRAM cell 124 can be a 1T1C cell consisting of one transistor and one capacitor. It is understood that DRAM cell 124 may be of any suitable configurations, such as 2T1C cell, 3T1C cell, etc. The vertical transistor 126 can be a MOSFET used to switch a respective DRAM cell 124. In some implementations, the vertical transistor 126 includes a semiconductor body 130 (the active region in which a channel can form) extending vertically (in the z-direction), and a gate structure 136 in contact with one side of semiconductor body 130. In a single-gate vertical transistor, the semiconductor body 130 can have a cuboid shape or a cylinder shape, and the gate structure 136 can abut a single side of semiconductor body 130 in a plane view, e.g., as shown in FIG. 1. In some implementations, the vertical transistor 126 has a structure including two or more gates, e.g., a two-gates structure, a three-gates structure, or a gate all around (GAA) structure. In some implementations, the gate structure 136 includes a gate electrode 134 and a gate dielectric 132 laterally between the gate electrode 134 and the semiconductor body 130 in a bit line direction (e.g., in the Y direction). In some implementations, the gate dielectric 132 abuts one side of the semiconductor body 130, and the gate electrode 134 abuts the gate dielectric 132.

As shown in FIG. 1, in some implementations, the semiconductor body 130 has two ends (the upper end and lower end in FIG. 1) in the vertical direction (the z-direction), and at least one end (e.g., the lower end) extends beyond gate dielectric 132 in the vertical direction (the z-direction) into the ILD layers. In some implementations, one end (e.g., the upper end) of the semiconductor body 130 is flush with the respective end (e.g., the upper end) of the gate dielectric 132. In some implementations, both ends (the upper end and lower end) of the semiconductor body 130 extend beyond the gate electrode 134, respectively, in the vertical direction (the z-direction) into ILD layers. That is, the semiconductor body 130 can have a larger vertical dimension (e.g., the depth) than that of the gate electrode 134 (e.g., in the z-direction), and neither the upper end nor the lower end of semiconductor body 130 is flush with the respective end of the gate electrode 134. Thus, short circuits between the bit lines 123 and the word lines/gate electrodes 134 or between the word lines/gate electrodes 134 and the capacitors 128 can be avoided. The vertical transistor 126 can further include a source and a drain (both referred to as 138 as their locations may be interchangeable) disposed at the two ends (the upper end and lower end) of the semiconductor body 130, respectively, in the vertical direction (the z-direction). In some implementations, one of the source and drain 138 (e.g., at the upper end in FIG. 1) is coupled to the capacitor 128, and the other one of source and drain 138 (e.g., at the lower end in FIG. 1) is coupled to the bit line 123. That is, the vertical transistor 126 can have a first terminal in the positive z-direction and a second terminal opposite the first terminal in the negative z-direction, as shown in FIG. 1.

In some implementations, the semiconductor body 130 includes semiconductor materials, such as single crystalline silicon, polysilicon, amorphous silicon, Ge, any other semiconductor materials, or any combinations thereof. In one example, semiconductor body 130 may include single crystalline silicon. Source and drain 138 can be doped with N+ type dopants (e.g., Phosphorus (P) or Arsenic (As)) or P-type dopants (e.g., Boron (B) or Gallium (Ga)) at a desired doping level. In some implementations, a silicide layer, such as a metal silicide layer, is formed between source/drain 138 of the vertical transistor 126 and the bit line 123 as the bit line contact or between source/drain 138 of the vertical transistor 126 and the first electrode of the capacitor 128 as capacitor contact 142 to reduce the contact resistance. In some implementations, gate dielectric 132 includes dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. In some implementations, gate electrode 134 includes a conductive material including, but not limited to W, Co, Cu, Al, TiN, TaN, polysilicon, silicide, or any combination thereof. In some implementations, the gate electrode 134 includes multiple conductive layers, such as a W layer over a TiN layer. In one example, the gate structure 136 may be a "gate oxide/gate poly" gate in which the gate dielectric 132 includes silicon oxide and gate electrode 134 includes doped polysilicon. In another example, gate structure 136 may be an HKMG in which gate dielectric 132 includes a high-k dielectric and gate electrode 134 includes a metal.

As described above, since the gate electrode 134 may be part of a word line or extend in the word line direction (e.g., the X direction) as a word line, the second semiconductor structure 104 of the 3D semiconductor device 100 can also include a plurality of word lines each extending in the word line direction. Each word line 134 can be coupled to a row of DRAM cells 124. That is, the bit line 123 and the word line 134 can extend in two perpendicular lateral directions, and the semiconductor body 130 of the vertical transistor 126 can extend in the vertical direction perpendicular to the two lateral directions in which the bit line 123 and the word line 134 extend. Word lines 134 are in contact with word line contacts (not shown). In some implementations, the word lines 134 include conductive materials including, but not limited to W, Co, Cu, Al, TiN, TaN, polysilicon, silicides, or any combination thereof. In some implementations, the word line 134 includes multiple conductive layers, such as a W layer over a TiN layer, as shown in FIG. 1.

In some implementations, as shown in FIG. 1, the vertical transistor 126 extends vertically through and contacts the word lines 134, and the source or drain 138 of vertical transistor 126 at the lower end thereof is in contact with the bit line 123 (or bit line contact if any). Accordingly, the word lines 134 and the bit lines 123 can be disposed in different planes in the vertical direction due to the vertical arrangement of vertical transistor 126, which simplifies the routing of the word lines 134 and the bit lines 123. In some implementations, the bit lines 123 are disposed vertically between the bonding layer 120 and the word lines 134, and the word lines 134 are disposed vertically between the bit lines 123 and the capacitors 128. The word lines 134 can be coupled to the peripheral circuits 112 in the first semiconductor structure 102 through word line contacts (not shown) in the interconnect layer 122, the bonding contacts 121 and 119 in the bonding layers 120 and 118, and the interconnects in the interconnect layer 116. Similarly, the bit lines 123 in the interconnect layer 122 can be coupled to the peripheral circuits 112 in the first semiconductor structure 102 through the bonding contacts 121 and 119 in the bonding layers 120 and 118 and the interconnects in the interconnect layer 116.

In some implementations, the vertical transistors 126 can be arranged in a mirror-symmetric manner to increase the density of DRAM cells 124 in the bit line direction (the Y direction). As shown in FIG. 1, two adjacent vertical transistors 126 in the bit line direction are mirror-symmetric to one another with respect to a trench isolation 160. That is, the second semiconductor structure 104 can include a plurality of trench isolations 160 each extending in the word line direction (the X direction) in parallel with word lines 134 and disposed between semiconductor bodies 130 of two adjacent rows of the vertical transistors 126. In some implementations, the rows of vertical transistors 126 separated by the trench isolation 160 are mirror-symmetric to one another with respect to the trench isolation 160. The trench isolation 160 can be formed with dielectric materials including, but not limited to, silicon oxide, silicon nitride, silicon oxynitride, low-k dielectrics, or any combination thereof. It is understood that the trench isolation 160 may include an air gap each disposed laterally between adjacent semiconductor bodies 130. Air gaps may be formed due to the relatively small pitches of vertical transistors 126 in the bit line direction (e.g., the Y direction). On the other hand, the relatively large dielectric constant of air in air gaps (e.g., about 4 times of the dielectric constant of silicon oxide) can improve the insulation effect between vertical transistors 126 (and rows of DRAM cells 124) compared with some dielectrics (e.g., silicon oxide). Similarly, in some implementations, air gaps are formed laterally between word lines/gate electrodes 134 in the bit line direction as well, depending on the pitches of word lines/gate electrodes 134 in the bit line direction. In some implementations, instead of having the air gaps in the trench isolation 160, a conductive material (e.g., metal such as W) is filled in the trench isolation 160 and surrounded by the dielectric materials. As described with further details below, the conductive material in the trench isolation 160 can be coupled out from the back side of the second semiconductor structure 104.

As shown in FIG. 1, in some implementations, a capacitor 128 includes a first electrode 144 above and coupled to the source or drain 138 of vertical transistor 126, e.g., the upper end of the semiconductor body 130, via a capacitor contact 142. In some implementations, the capacitor contact 142 is an ohmic contact, such as a metal silicide contact, as opposed to a Schottky contact. For example, the capacitor contact 142 may include metal silicides, such as WSi, CoSi, CuSi, AlSi, or any other suitable metal silicides having higher conductivities than doped silicon. The capacitor 128 can also include a capacitor dielectric above and in contact with the first electrode 144, and a second electrode above and in contact with the capacitor dielectric. That is, the capacitor 128 can be a vertical capacitor in which the electrodes and capacitor dielectric are stacked vertically (in the z-direction), and the capacitor dielectric can be sandwiched between the electrodes. In some implementations, each first electrode is coupled to source or drain 138 of a respective vertical transistor 126 in the same DRAM cell, while all second electrodes are coupled to a common plate 146 coupled to the ground, e.g., a common ground. The capacitor 128 can have a first end in the negative z-direction and a second end opposite the first end in the positive z-direction, as shown in FIG. 1. In some implementations, the first end of the capacitor 128 is coupled to the first terminal of the vertical transistor 126 via an ohmic contact (e.g., the capacitor contact 142 made of a metal silicide material). As shown in FIG. 1, the second semiconductor structure 104 can further include a capacitor contact 147 (e.g., a conductor) in contact with a common plate 146 for coupling the capacitors 128 to the peripheral circuits 112 or to the ground directly. In some implementations, the capacitor contact 147 (e.g., a conductor) extends in the z-direction from the dielectric layer of the bonding layer 120 to couple to the second end of the capacitor 128 via the common plate 146, as shown in FIG. 1. In some implementation, the ILD layer in which the capacitors 128 are formed has the same dielectric material as the two ILD layers into which the semiconductor body 130 extends, such as silicon oxide.

It is understood that the structure and configuration of a capacitor 128 are not limited to the example in FIG. 1 and may include any suitable structure and configuration, such as a planar capacitor, a stack capacitor, a multi-fins capacitor, a cylinder capacitor, a trench capacitor, or a substrate-plate capacitor. In some implementations, the capacitor dielectric includes dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. It is understood that in some examples, a capacitor 128 may be a ferroelectric capacitor used in a FRAM cell, and the capacitor dielectric may be replaced by a ferroelectric layer having ferroelectric materials, such as PZT or SBT. In some implementations, the electrodes include conductive materials including, but not limited to W, Co, Cu, Al, TiN, TaN, polysilicon, silicides, or any combination thereof.

As shown in FIG. 1, vertical transistor 126 extends vertically through and contacts the word lines 134, source or drain 138 of vertical transistor 126 at the lower end thereof is in contact with the bit line 123, and source or drain 138 of vertical transistor 126 at the upper end thereof is coupled to the capacitor 128. That is, the bit line 123 and the capacitor 128 can be disposed in different planes in the vertical direction and coupled to opposite ends of vertical transistor 126 of DRAM cell 124 in the vertical direction due to the vertical arrangement of vertical transistor 126. In some implementations, the bit line 123 and the capacitor 128 are disposed on opposite sides of the vertical transistor 126 in the vertical direction, which simplifies the routing of the bit lines 123 and reduces the coupling capacitance between the bit lines 123 and the capacitors 128 compared with DRAM cells in which the bit lines and capacitors are disposed on the same side of the planar transistors.

As shown in FIG. 1, in some implementations, the vertical transistors 126 are disposed vertically between the capacitors 128 and the bonding interface 106. That is, the vertical transistors 126 can be arranged closer to the peripheral circuits 112 of the first semiconductor structure 102 and the bonding interface 106 than the capacitors 128. Since the bit lines 123 and the capacitors 128 are coupled to opposite ends of the vertical transistors 126, the bit lines 123 (as part of the interconnect layer 122) are disposed vertically between the vertical transistors 126 and the bonding interface 106 As a result, the interconnect layer 122 including bit lines 123 can be arranged close to the bonding interface 106 to reduce the interconnect routing distance and complexity.

In some implementations, the second semiconductor structure 104 further includes a substrate 148 disposed above the DRAM cells 124. The substrate 148 can be part of a carrier wafer. It is understood that in some examples, the substrate 148 may not be included in the second semiconductor structure 104.

As shown in FIG. 1, the second semiconductor structure 104 can further include a pad-out interconnect layer 150 above the substrate 148 and the DRAM cells 124. The pad-out interconnect layer 150 can include interconnects, e.g., contact pads 154, in one or more ILD layers. The pad-out interconnect layer 150 and the interconnect layer 122 can be formed on opposite sides of the DRAM cells 124. The capacitors 128 can be disposed vertically between the vertical transistors 126 and the pad-out interconnect layer 150. In some implementations, the interconnects in pad-out interconnect layer 150 can transfer electrical signals between the 3D semiconductor device 100 and outside circuits, e.g., for pad-out purposes.

In some implementations, the second semiconductor structure 104 further includes one or more contacts 152 extending through the substrate 148 and part of the pad-out interconnect layer 150 to couple the pad-out interconnect layer 150 to the DRAM cells 124 and the interconnect layer 122. As a result, the peripheral circuits 112 can be coupled to the DRAM cells 124 through the interconnect layers 116 and 122 as well as the bonding layers 120 and 118, and the peripheral circuits 112 and the DRAM cells 124 can be coupled to outside circuits through contacts 152 and pad-out interconnect layer 150. Contact pads 154 and contacts 152 can include conductive materials including, but not limited to, W, Co, Cu, Al, silicides, or any combination thereof. In one example, the contact pad 154 may include Al, and the contact 152 may include W. In some implementations, the contact 152 includes a via surrounded by a dielectric spacer (e.g., having silicon oxide) to electrically separate the via from substrate 148. Depending on the thickness of substrate 148, contact 152 can be an ILV having a depth in the submicron level (e.g., between 10 nm and 1 μm), or a TSV having a depth in the micron- or tens micron-level (e.g., between 1 μm and 100 μm).

Although not shown, it is understood that the pad-out of 3D memory devices is not limited to from the second semiconductor structure 104 having DRAM cells 124 as shown in FIG. 1 and may be from the first semiconductor structure 102 having peripheral circuit 112. Although not shown, it is also understood that the air gaps between word lines 134 and/or between semiconductor bodies 130 may be partially or fully filled with dielectrics. Although not shown, it is further understood that more than one array of DRAM cells 124 may be stacked over one another to vertically scale up the number of DRAM cells 124.

In some implementations, instead of having the substrate 148 above the DRAM cells 124 as shown in FIG. 1, the second semiconductor structure 104 includes a substrate disposed below the DRAM cells 124. The substrate can be part of a carrier wafer. The DRAM cells 124 can be formed in a front side of the substrate, and the bit lines 123 can be formed in a back side of the substrate. The bit lines 123 can be conductively coupled to the DRAM cells 124 (e.g., the terminals 138 of the vertical transistors 126) through the substrate. As described with further details below, the conductive material filled in the trench isolation 160 can be exposed from the back side of the substrate and coupled to, for example, a conductive interconnect.

Figure 2A:
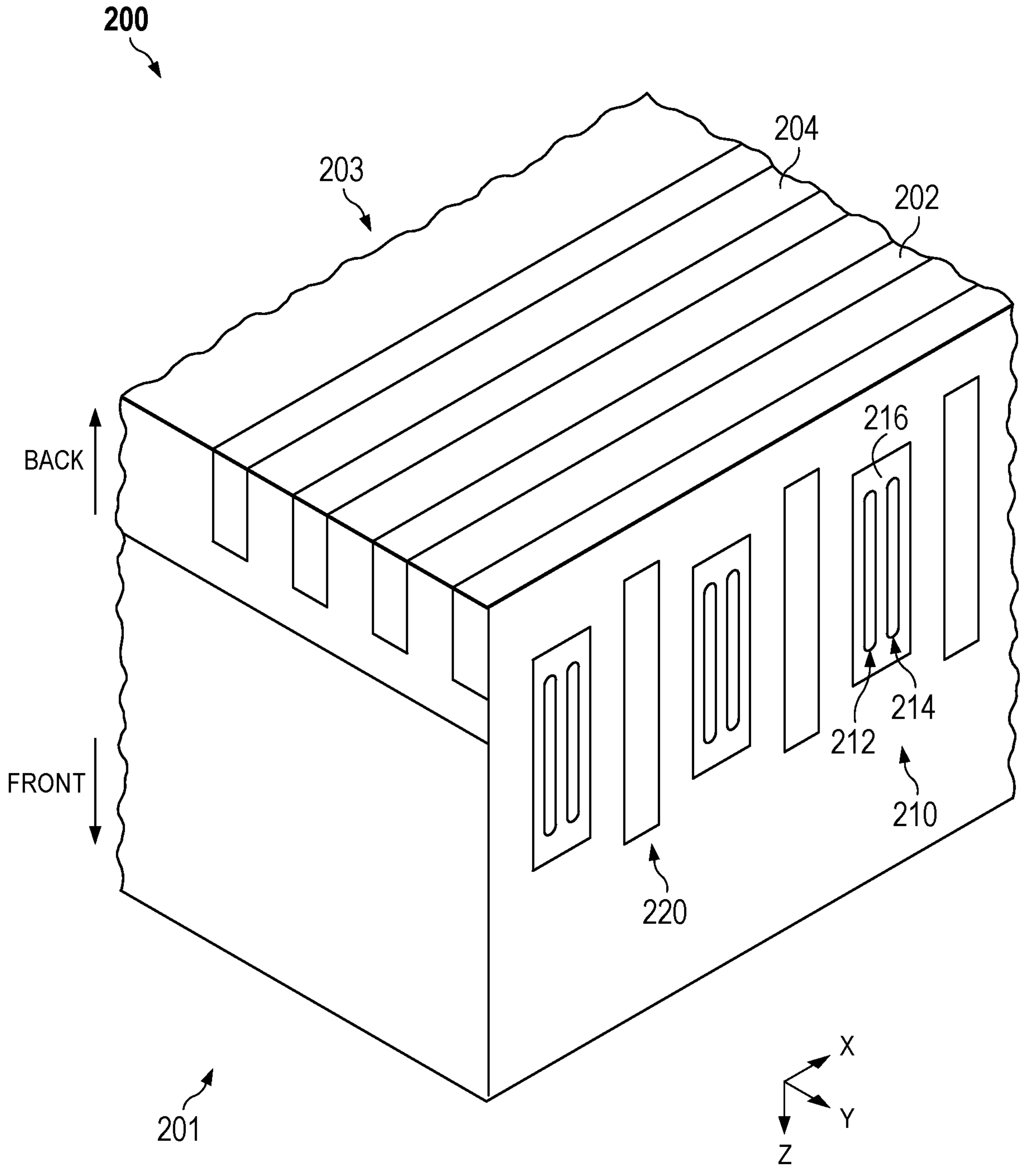
FIG. 2A illustrates a perspective view of an example 3D semiconductor device.

FIG. 2A shows a perspective view of an example 3D semiconductor device 200. The 3D semiconductor device 200 can be similar to, or same as, the 3D semiconductor device 100 of FIG. 1, or a part of the 3D semiconductor device 100 of FIG. 1 (e.g., the second semiconductor structure 104 of FIG. 1), or a structure at an intermediate fabrication process of the 3D semiconductor device 100 of FIG. 1.

As shown in FIG. 2A, the 3D semiconductor device 200 has a front side 201 and a back side 203 along a vertical direction (the Z direction). The 3D semiconductor device 200 includes a plurality of bit lines 202 separated by an isolating material 204 (e.g., oxide) in the back side 203. The bit line 202 can be similar to, or same as, the bit line 123 of FIG. 1. The bit lines 202 can be separated along the X direction and extend along the Y direction.

The 3D semiconductor device 200 can include strings of memory cells in the front side 201. Each string of memory cells can be coupled to a corresponding bit line 202. A memory cell can be similar to, or same as, the DRAM cell 124 of FIG. 1. The memory cell can include a vertical transistor (e.g., the vertical transistor 126 of FIG. 1) and a capacitor (e.g., the capacitor 128 of FIG. 1) coupled to the vertical transistor. In some implementations, gate structures (e.g., the gate structure 136 of FIG. 1) of two vertical transistors 212, 214 can be formed in a trench structure 210 and separated by an isolating material 216 (e.g., oxide) in the trench structure 210. Adjacent trench structures 210 (or adjacent vertical transistors in the adjacent trench structures 210) can be separated by an isolating region 220 (e.g., the trench isolation 160 of FIG. 1) along the X direction. As discussed with further details below, the isolating region 220 can include a conductive material surrounded by a dielectric material in a trench between the adjacent trench structures 210.

Figure 2B:
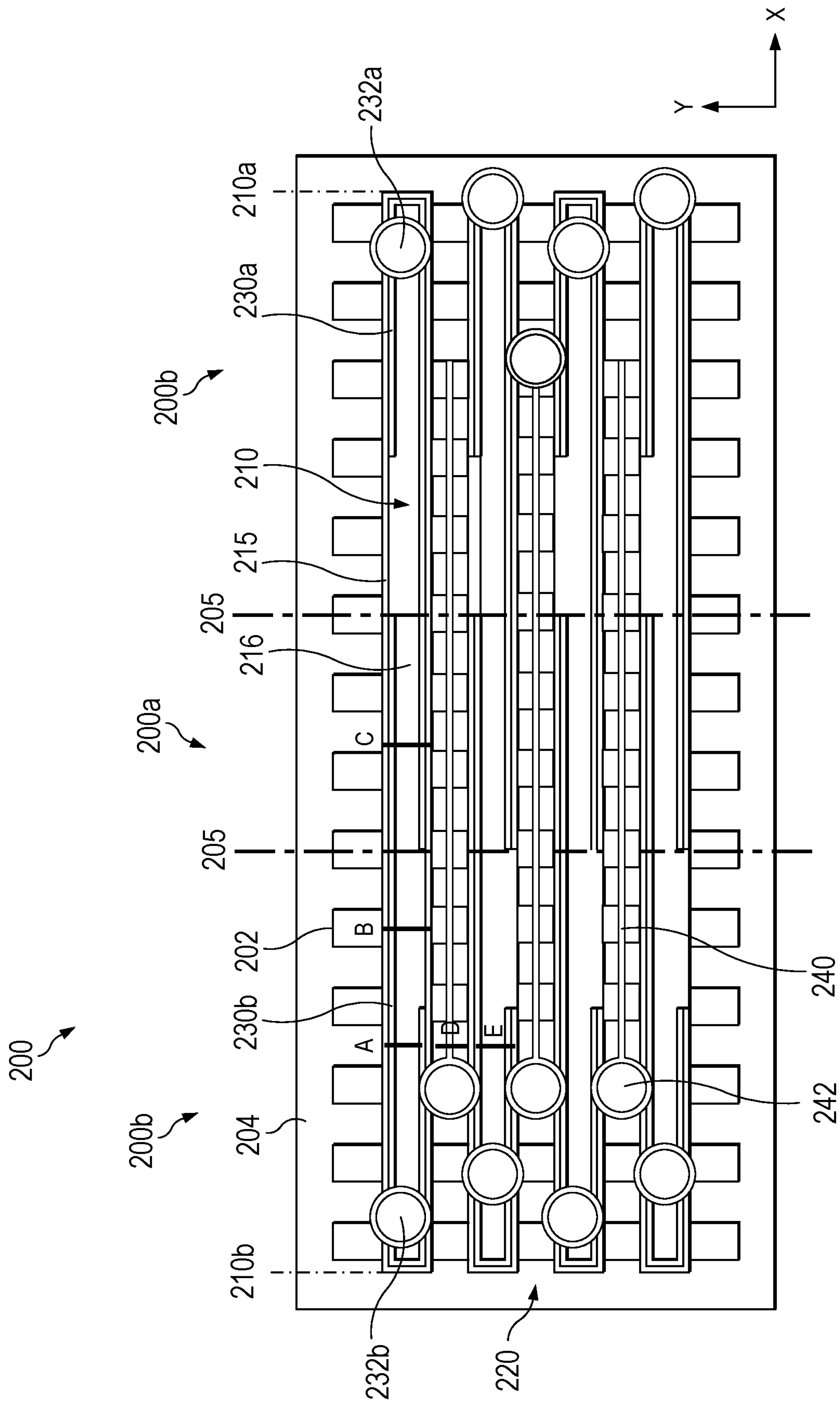
FIG. 2B illustrates a top view of the example 3D semiconductor device of FIG. 2A.

FIG. 2B illustrates the example 3D semiconductor device 200 of FIG. 2A in the XY plane. The 3D semiconductor device 200 can include a first region 200*a* (e.g., an array region) and one or more second regions 200*b* (e.g., a connection region) adjacent to the first region 200*a* along the X direction. As illustrated in FIG. 2B, the first region 200*a* is between a left second region 200*b* and a right second region 200*b* (e.g., along X direction). The left and right second regions 200*b* can be symmetric with respect to the first region 200*a*. A boundary line 205 between the first region 200*a* and a corresponding second region 200*b* is shown in FIG. 2B.

The plurality of bit lines 202 extend along Y direction and are arranged along the X direction. As described above, since a gate electrode (e.g., the gate electrode 134 of FIG. 1) of the vertical transistor 212, 214 may be part of a word line or extend in the word line direction (e.g., the X direction) as a word line, the 3D semiconductor device 200 can also include a plurality of word lines each extending in the word line direction. Each word line can be coupled to a row of vertical transistors. The vertical transistors 212, 214 can be coupled to two different word lines. In some implementations, the first region 200*a* includes an array of memory cells (e.g., the memory cells 124 of FIG. 1), and the one or more second regions 200*b* include one or more conductive contacts configured to respectively couple to each of the plurality of word lines.

In some implementations, as illustrated in FIG. 2B, the trench structure 210 includes two word lines 230*a*, 230*b* (e.g., the word line 134 of FIG. 1) formed on an inner surface of the trench structure 210 and isolated by the isolating material 216. In some cases, a dielectric layer 215 (e.g., including SiN) can be disposed between the inner surface and the word lines 230*a*, 230*b*. In some implementations, each word line 230*a*, 230*b* is coupled to gate electrodes of corresponding vertical transistors, e.g., vertical transistors 212, 214 respectively. In some implementations, the gate electrodes of the corresponding vertical transistors are connected together to form the word line 230*a*, 230*b*.

Each word line 230*a*, 230*b* can include one or more layers, e.g., high-K dielectric layer, an intermediate layer (e.g., TiN), and a metallic layer (e.g., W). The word line 230*a*, 230*b* can be formed by cutting the one or more layers formed in the trench structure 210. In some implementations, the one or more layers are cut at ends of the trench structure 210. In some implementations, e.g., as illustrated in FIG. 2B, the one or more layers are cut at positions away from two ends 210*a*, 210*b* of the trench structure 210. Each word line 230*a*, 230*b* can have a U shape around a corresponding end of the trench structure 210. Each word line 230*a*, 230*b* can be coupled out through a respective conductive pad 232*a*, 232*b* adjacent to the corresponding end 210*a*, 210*b* of the trench structure 210, such that the respective conductive pad 232*a*, 232*b* has a large area.

In some implementations, e.g., as illustrated in FIG. 2B, the word line 230*a* extends around a first end 210*a* of the trench structure 210 in the right second region 200*b*, and the conductive pad 232*a* is adjacent to the first end 210*a* in the right second region 200*b* and conductively coupled to the word line 230*a*. Similarly, the word line 230*b* extends around a second end 210*b* of the trench structure 210 in the left second region 200*b*, and the conductive pad 232*b* is adjacent to the second end in the left second region 200*b* and conductively coupled to the word line 230*b*. In some implementations, to enlarge the areas of the conductive pads and to avoid overlapping between the conductive pads, adjacent conductive pads 232*a* in the right second region 200*b* can have different distances from the first end 210*a* of the trench structure 210, and adjacent conductive pads 232*b* in the left second region 200*b* can have different distances from the second end 210*b* of the trench structure 210.

As described above, the isolating region 220 is between adjacent trench structures 210 and can include the conductive material (e.g., metal) surround by the isolating material. Also, as described with further details below, the conductive material in the isolating region 220 can be exposed/etched, e.g., by etching from the back side 203, without exposing the word lines 230*a*, 230*b* in the trench structures 210. The conductive material of the isolating region 220 can be coupled to a conductive interconnection 240. The conductive interconnection 240 can be coupled out through a conductive pad 242. Adjacent conductive pads 242 can be arranged adjacent to opposite ends of the isolating region 220, e.g., one in the left second region 200*b* and one in the right second region 200*b*. In some implementations, the conductive pads 232*a*, 232*b* for coupling out the word lines 230*a*, 230*b* are on the front side 201 of the 3D semiconductor device 200, and the conductive pads 242 for coupling out the conductive interconnection 240 are on the back side 203 of the 3D semiconductor device 200. In some implementations, the conductive pads 232*a*, 232*b*, and the conductive pads 242 are on a same side, e.g., the front side 201 of the 3D semiconductor device 200, e.g., as illustrated in FIG. 2B.

For illustration purposes, as described with further details in FIGS. 3A-3E and 4A-4E, cross sectional views at positions A, B, C along X direction are shown, and cross sectional views at positions A. D. E along Y direction are shown. The structures shown in FIGS. 3A-3E and FIGS. 4A-4E can be formed before forming the conducive pads 232*a*, 232*b* and/or the conductive pads 242. Note that the positions A, B, C are all in the trench structure 210, where positions A, B are in the second region 200*b* and C is in the first region 200*a*; the positions A, E are at adjacent trench structures 210 and D is at the isolating region 220. The positions A. D. E can have a same position at X direction. In some examples, as shown in FIG. 2B, the position A crosses two sides of the word line 230*b*, and the position B crosses only one side of the word line 230*b* and a space between the word lines 230*a* and 230*b*. For comparison and/or for convenience, in the following, the cross sectional views at the positions A, B, C are presented together, and the cross sectional views at the positions A, D, E are presented together. Cross sectional views at positions A and E can be same due to a periodicity of the trench structures 210.

Figure 3A:
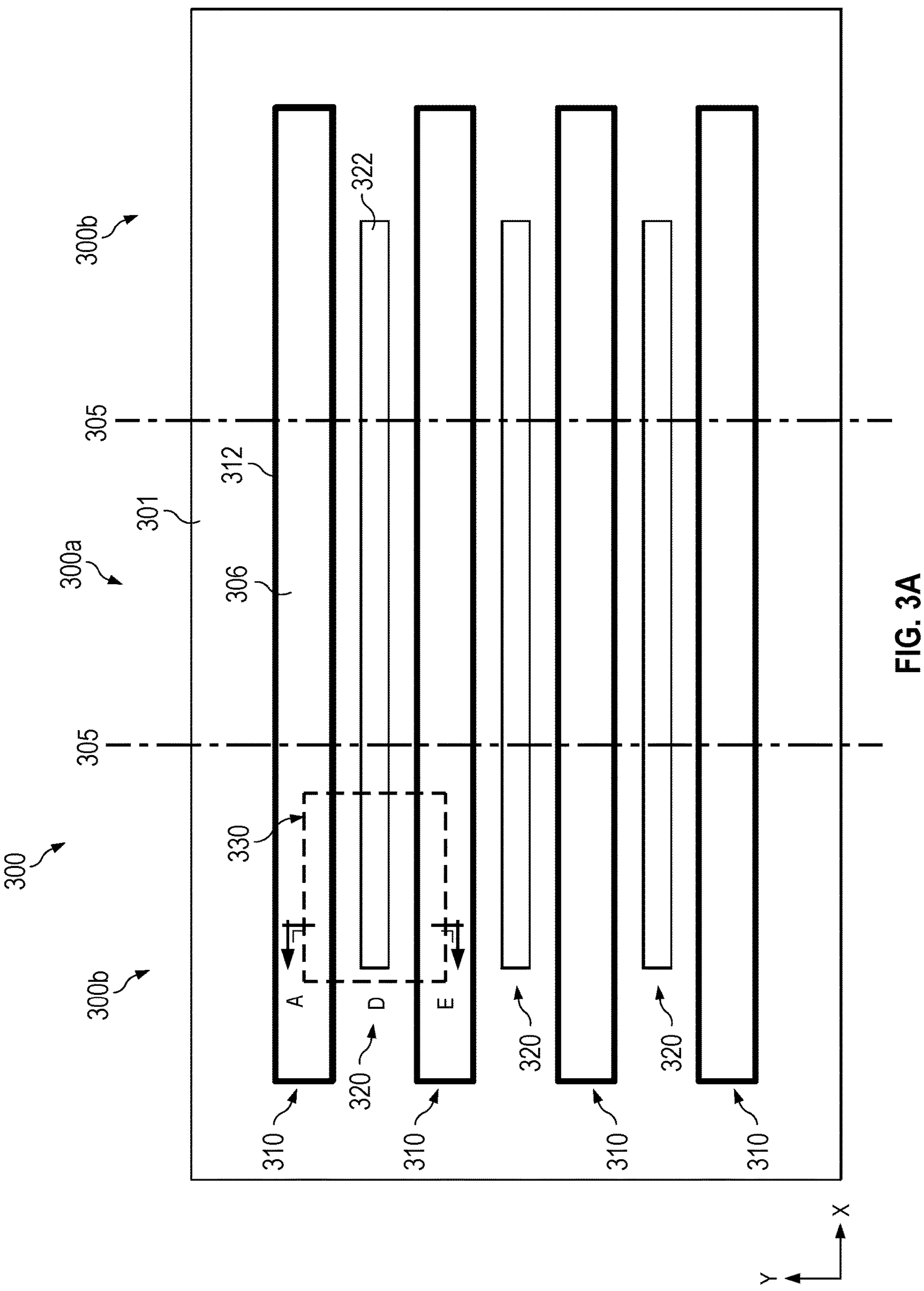
FIGS. 3A-3C illustrates cross-sectional views at different positions of an example 3D semiconductor structure along a first lateral direction.
Figure 3B:
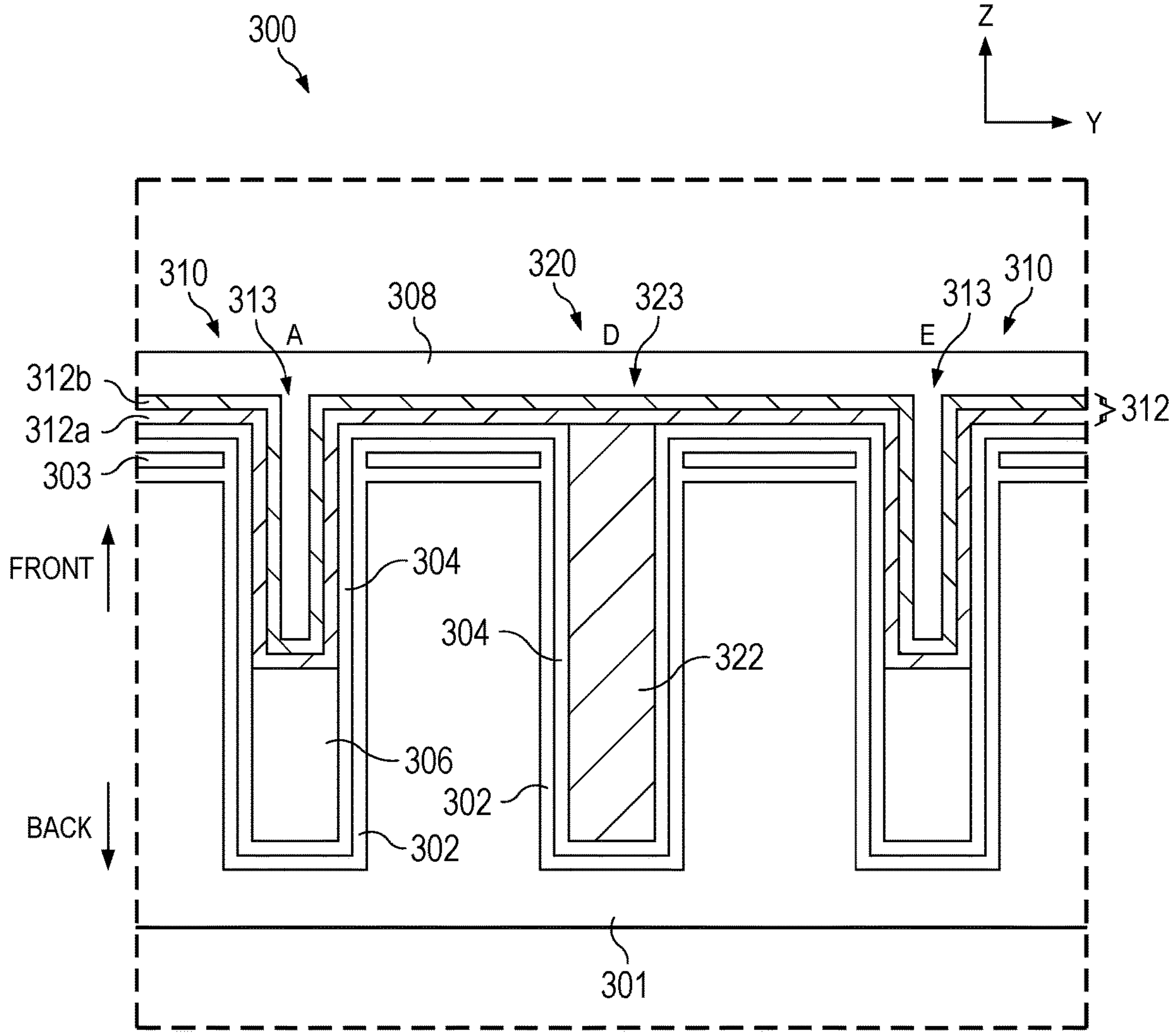
Figure 3C:
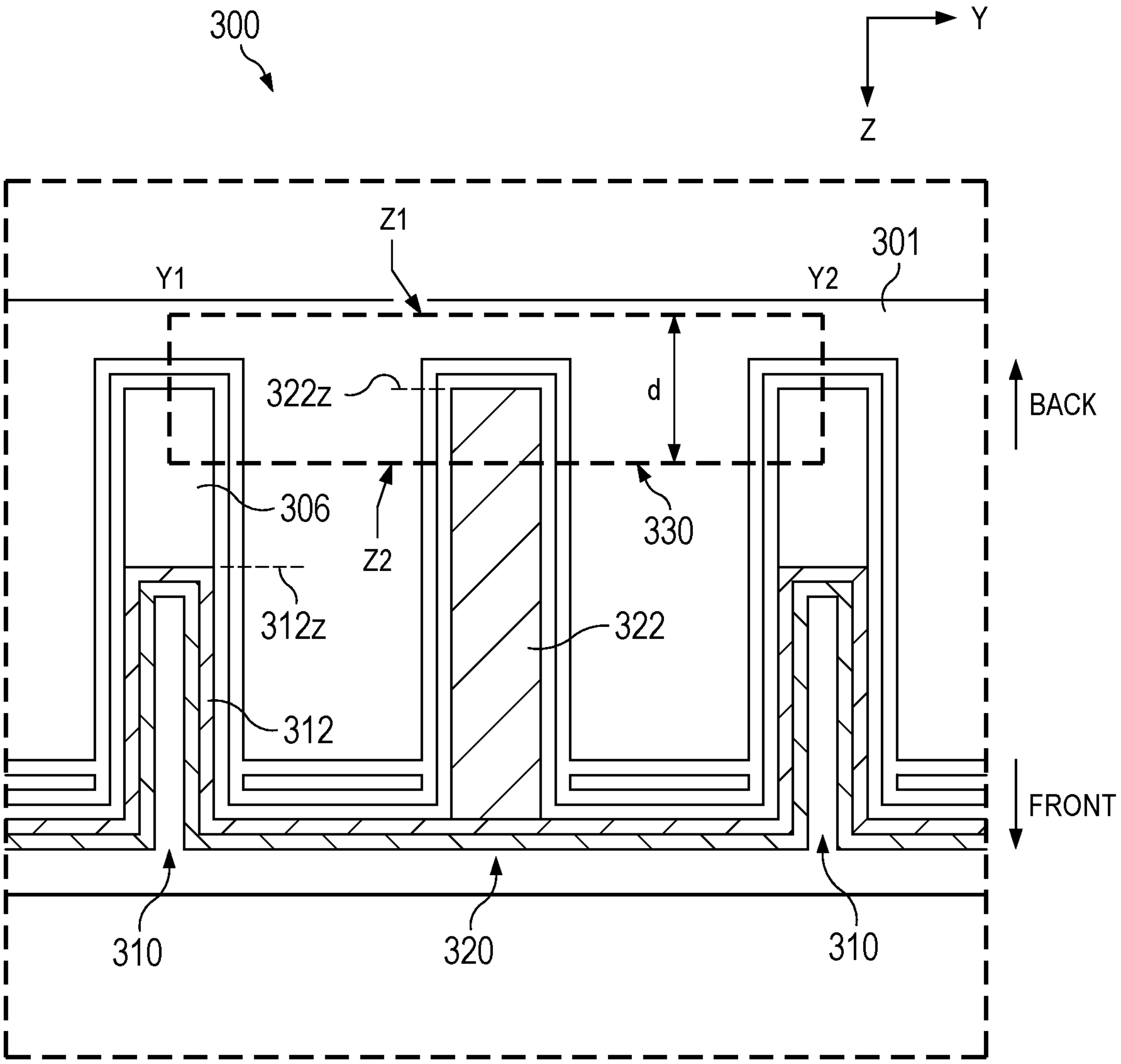
Figure 3D:
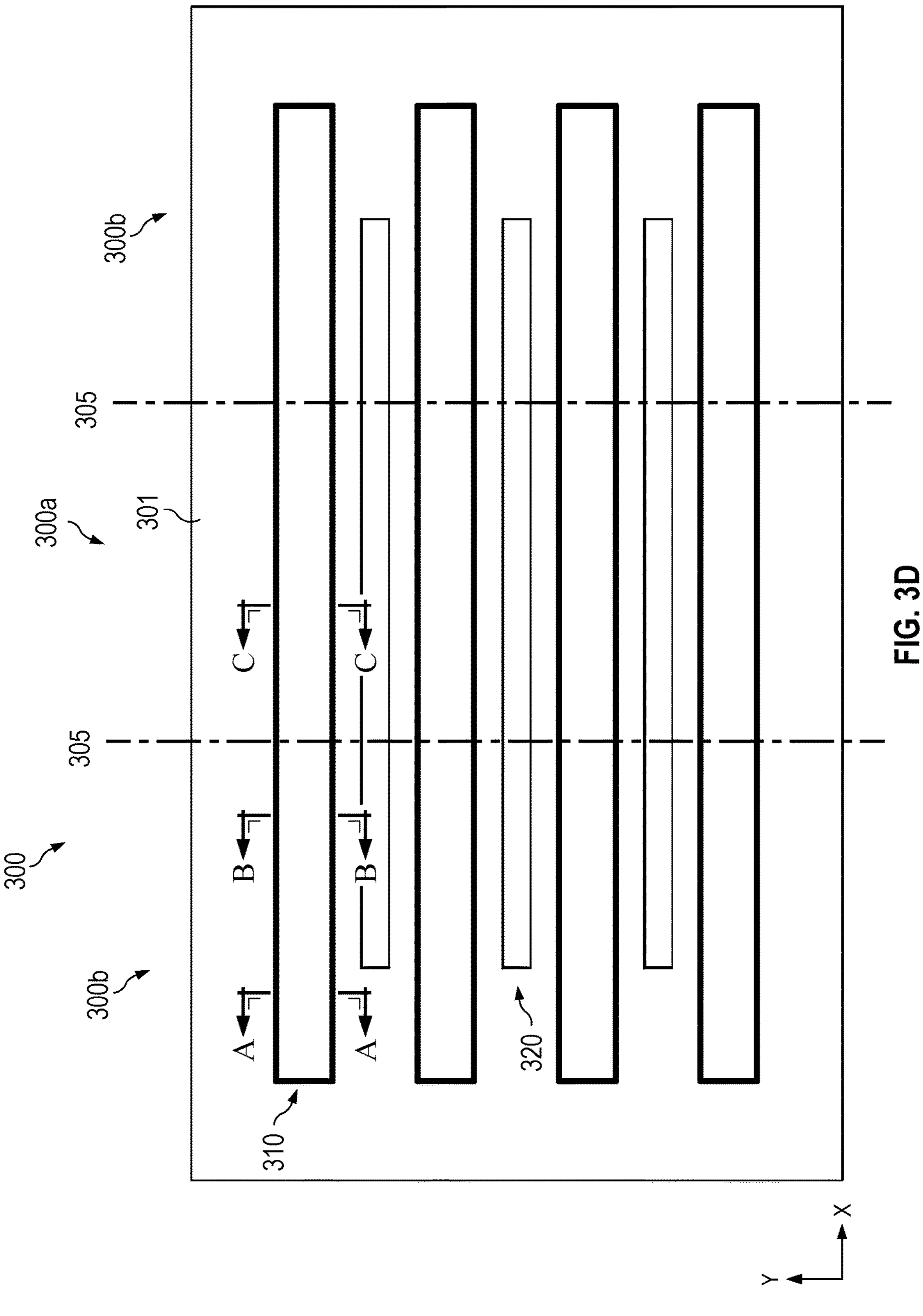
FIGS. 3D-3E illustrates cross-sectional views at different positions of the example 3D semiconductor structure of FIGS. 3A-3C along a second lateral direction.
Figure 3E:
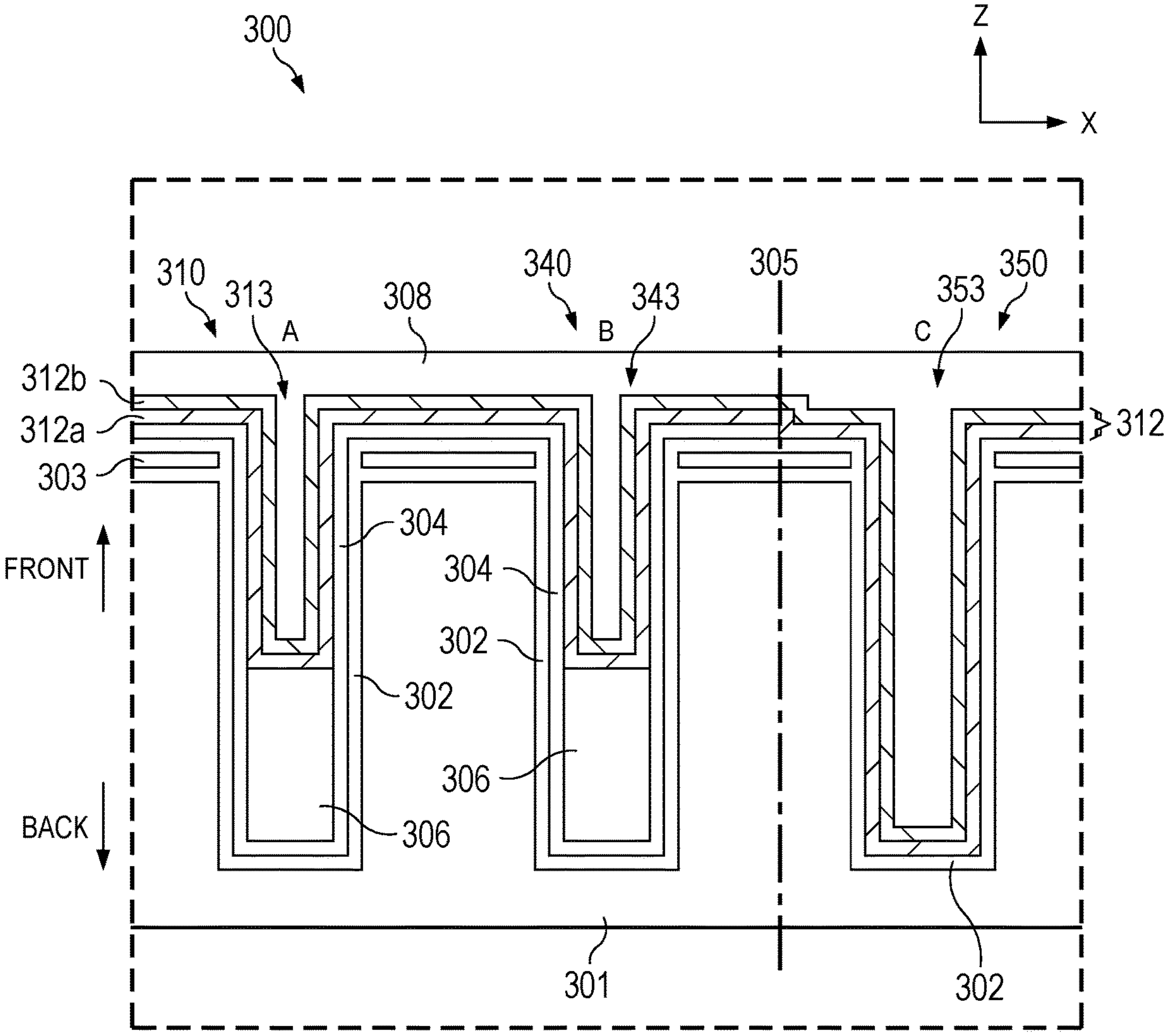

FIGS. 3A-3C illustrate cross-sectional views at different positions A, D, E of an example 3D semiconductor structure 300 along a first lateral direction (e.g., Y direction). FIGS. 3D-3E illustrate cross-sectional views at different positions A, B, C of the example 3D semiconductor structure 300 of FIGS. 3A-3C along a second lateral direction (e.g., X direction). The 3D semiconductor structure 300 can be similar to, or same as, the 3D semiconductor device 200 of FIGS. 2A-2B, or a structure at an intermediate fabrication process of the 3D semiconductor device 200. For example, the 3D semiconductor structure 300 can be a structure before coupling out conductive materials in isolating regions between adjacent trench structures and/or before cutting at least one conductive layer in trench structures to form two separate vertical gates. Note that the positions A, B, C, D, E are defined to be the same as those illustrated in FIG. 2B.

As shown in FIG. 3A, the 3D semiconductor structure 300 includes a plurality of trench structures 310 in a semiconductor substrate 301, e.g., forming from a front side of the semiconductor substrate 301. Adjacent trench structures 310 are separated by a corresponding isolating region 320 that can be formed in a middle trench between the adjacent trench structures 310. The trench structure 310 can be similar to, or same as, the trench structure 210 of FIGS. 2A-2B. The isolating region 320 can be similar to, or same as, the trench isolation 160 of FIG. 1 or the isolating region 220 of FIGS. 2A-2B.

In some implementations, e.g., as shown in FIG. 3B, the trench structures 310 and the isolating region 320 are formed based on corresponding trenches 313, 323. The trenches 313, 323 can have a same depth along a vertical direction (e.g., Z direction). An isolating layer 302 (e.g., including oxide) can be first formed on an inner surface of the trenches 313, 323. Then a dielectric layer 304 (e.g., including SiN) can be formed on the isolating layer 302 in the trenches 313, 323. As discussed with further details in FIGS. 4B-4E, the trench structure 310 includes an isolating material 306 deposited in a portion of the trench 313 from a bottom of the trench 313. At least one conductive layer 312 can be deposited on top of the deposited isolating material 306 in the portion of the trench 313. The at least one conductive layer 312 can be cut to form two independent vertical gates (e.g., the gate electrodes 134 of FIG. 1) for vertical transistors (e.g., the vertical transistors 126 of FIG. 1 or the vertical transistors 212, 214 of FIG. 2A). In some implementations, a dielectric layer 303 is formed in the isolating layer 302 between adjacent trenches. The dielectric layer 303 can include a dielectric material, e.g., SiN.

In some examples, the at least one conductive layer 312 includes an intermediate layer 312*a* (e.g., including TiN) and a metallic layer 312*b* (e.g., including W). The trench structure 310 can include a high-K dielectric layer between the at least one conductive layer 312 (e.g., the intermediate layer 312*a*) and the dielectric layer 304. As discussed above, the at least one conductive layer 312 can be used as a gate electrode (e.g., the gate electrode 134 of FIG. 1) of a vertical transistor and/or be at least a portion of a word line (e.g., the word line 230*a*, 230*b* of FIG. 2B). The gate electrode, the dielectric layer 304, and the isolating layer 302 can form a gate structure (e.g., the gate structure 136 of FIG. 1) of the vertical transistor.

Along the vertical direction, a length (or thickness) of the deposited isolating material 306 in the portion of the trench 313, e.g., from a bottom surface of the trench 313 to a bottom surface of the at least one conductive layer 312 (or the vertical gate electrodes) in the trench 313. The length can be about tens of nm, e.g., in a range from 10 nm to 100 nm. Thus, a length of the at least one conductive layer 312 or a length of the vertical gate electrode to be formed is smaller than a depth of the trench 313 by the length of the deposited isolating material 306. In contrast, the isolating region 320 includes a conductive material (e.g., metal such as W) 322 that can be deposited in the trench 323 from a bottom of the trench 323. As discussed with further details in FIGS. 4D-4E, there is no isolating material 306 in the trench 323, and the deposited conductive material 322 can have a length (or thickness or depth) from the bottom surface of the trench 323 to a top surface of the trench 323, which can be identical to a depth of the trench 323. Since the trenches 313 and 323 can have a same depth, the length of the deposited conductive material 322 in the entirety of the trench 323 is greater than the length of the deposited isolating material 306 in the portion of the trench 313, also greater than the length of the at least one conductive layer 312 or the length of the vertical gate electrode along the vertical direction.

The at least one conductive layer 312 can be also formed on a top of the isolating region 320, e.g., on top of the deposited conductive material 322 in the trench 323. An isolating layer 308 can be deposited on the at least one conductive layer 312. The isolating layer 308 can include an isolating material such as oxide. As shown in FIG. 3B, the isolating layer 308 can be formed in the trench 313 of the trench structure 310 and on top of the isolating region 320.

The 3D semiconductor structure 300 can be flipped over with the back side of the semiconductor substrate 301 facing up, e.g., for further processing. As shown in FIG. 3C, the semiconductor substrate 301 can be etched from the back side to expose the conductive material 322 in the isolating region 320 or in the trench 323. As the length of the conductive material 322 filled in the trench 323 is greater than the length of the at least one conductive layer 312 formed in the trench 313, an end of the conductive material 322 is closer to a surface (e.g., a top surface) of the semiconductor substrate 301 in the back side than an end of the at least one conductive layer 312 in the trench 313.

As illustrated in FIG. 3C, the semiconductor substrate 301 can be etched in an etching region 330. The etching region 330 can have a top edge z1 (e.g., the surface of the semiconductor substrate 301) and a bottom edge 22 and an etching depth d from the surface of the semiconductor substrate or the top edge z1 to the bottom edge 22. Along the vertical direction, the etching depth d is greater than a first distance between the surface of the semiconductor substrate 301 or the top edge z1 and an end 322*z* of the conductive material 322 filled in the trench 323, and smaller than a second distance between the surface of the semiconductor substrate 301 or the top edge z1 and an end 312*z* of the deposited at least one conductive layer 312 in the trench 313. In some implementations, the etching region 330 has two opposite edges Y1, Y2 within the two adjacent trenches 313 along the horizontal direction (e.g., Y direction). As the etching region can extend to adjacent trenches 313 without etching to the vertical gate electrodes, an etching window becomes larger, compared to a structure without the deposited isolating material 306 in the trenches 313. In some implementations, the semiconductor substrate 301 is etched in an even larger etching region/window across the plurality of trench structures 310 and the isolating regions 320 along the Y direction.

In some implementations, as shown in FIG. 3A, the 3D semiconductor structure 300 includes a first region 300*a* (e.g., the first region 200*a* of FIG. 2B) and a second region 300*b* (e.g., the second region 200*b* of FIG. 2B) that have a boundary line 305 (e.g., the boundary line 205 of FIG. 2B) along the X direction.

FIGS. 3D-3E illustrates the cross-sectional views at the different positions A, B, C of the example 3D semiconductor structure 300 along the X direction. As shown in FIG. 2B, positions A and B are in the second region 300*b*, e.g., a connection region, while position C is in the first region 300*a*, e.g., an array region. A trench structure 350 at position C is configured to vertical gates of vertical transistors of memory cells in the second region 300*b*. As described with further details in FIGS. 4C-4E, similar to the isolating region 320, there is no isolating material 306 deposited in a trench 353 of the trench structure 350. Further, there can be no dielectric layer 304 formed in the trench 353. The at least one conductive layer 312 is conformally formed on the isolating layer 302 in the trench 353. Thus, a length of the at least one conductive layer 312 in the trench 353 (or a vertical gate formed in the trench structure 350) is greater than the length of the at least one conductive layer 312 in the trench 313 (or a vertical gate formed in the trench structure 310).

A trench structure 340 at position B can be similar to, or same as, the trench structure 310 at position A. The trench structure 340 includes the isolating material 306 filled in a bottom portion of a trench 343, the at least one conductive layer 312 on top of the filled isolating material 306 in the trench 343, and the isolating layer 308 on the at least one conductive layer 312 in the trench 343. As there is a dielectric layer 304 in the trench 343 and there is no dielectric layer 304 in the trench 353, a surface of the at least one conductive layer 312 adjacent to the trench 353 can be lower than a surface of the at least one conductive layer 312 adjacent to the trench 343, e.g., as illustrated in FIG. 3E.

In some implementations, from the back side of the semiconductor substrate 301, the semiconductor substrate 301 is etched in an etching region/window that is in the second region 300*b* but not in the first region 300*a*, e.g., not beyond the boundary line 305 along the X direction. In some implementations, from the back side of the semiconductor substrate 301, the semiconductor substrate 301 is etched in an etching region/window in both the second region 300*b* and in the first region 300*a*, such that the conductive material 322 in the isolating region 320 in the second region 300*b* can be exposed and/or etched for coupling out, and that the at least one conductive layer 312 in a bottom of the trench 353 in the first region 300*a* can be etched or cut to form vertical gates of vertical transistors of memory cells. By etching together the conductive material 322 in the isolating region 320 and the at least one conductive layer 312 for forming the vertical gates of the memory cells in the first region, the techniques implemented in the present disclosure enable to reduce fabrication cost and fabrication difficulty, eliminate issues or risks due to metal punch from a front side of the semiconductor substrate (e.g., hard to control due to line wiggling), and optimize the fabrication process (e.g., omit one or more processing operations such as high cost oxide recess operation).

FIGS. 4A-4E show cross-sectional views of structures of an example 3D semiconductor structure at various stages of a fabrication process. The 3D semiconductor structure can be similar to, or same as, the 3D semiconductor structure 300 of FIGS. 3A-3B. Note that, for illustration purposes, each of FIGS. 4A-4E includes cross-sectional views of a corresponding structure in diagrams (a) and (b), respectively. Diagram (a) shows cross-sectional views of the corresponding structure at positions A, D, E in YZ plane, while diagram (b) shows cross-sectional views of the corresponding structure at positions A, B, C in XZ plane. The positions A, B, C, D, E are defined same as in FIG. 2B and FIGS. 3A-3E.

Figure 4A:
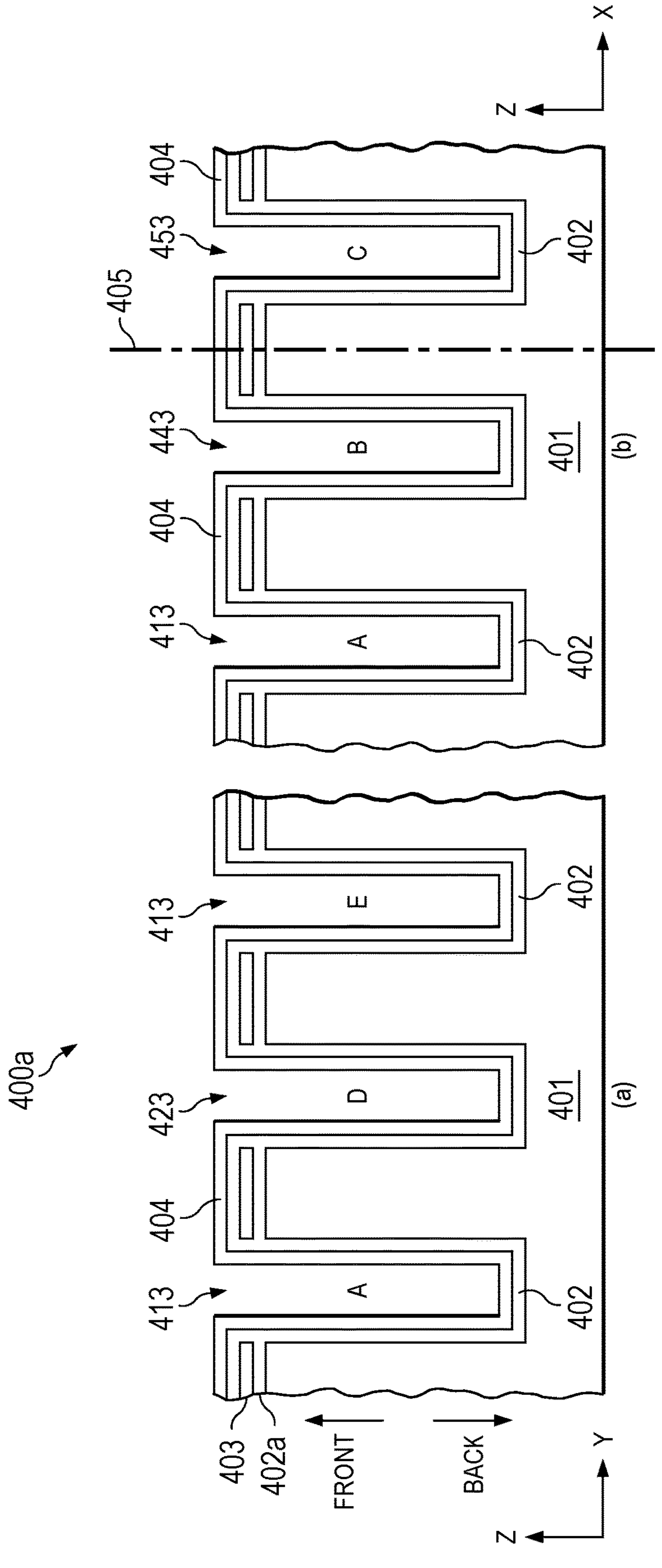
FIGS. 4A-4E show cross-sectional views of structures of a 3D semiconductor structure at various stages of a fabrication process.
Figure 4B:
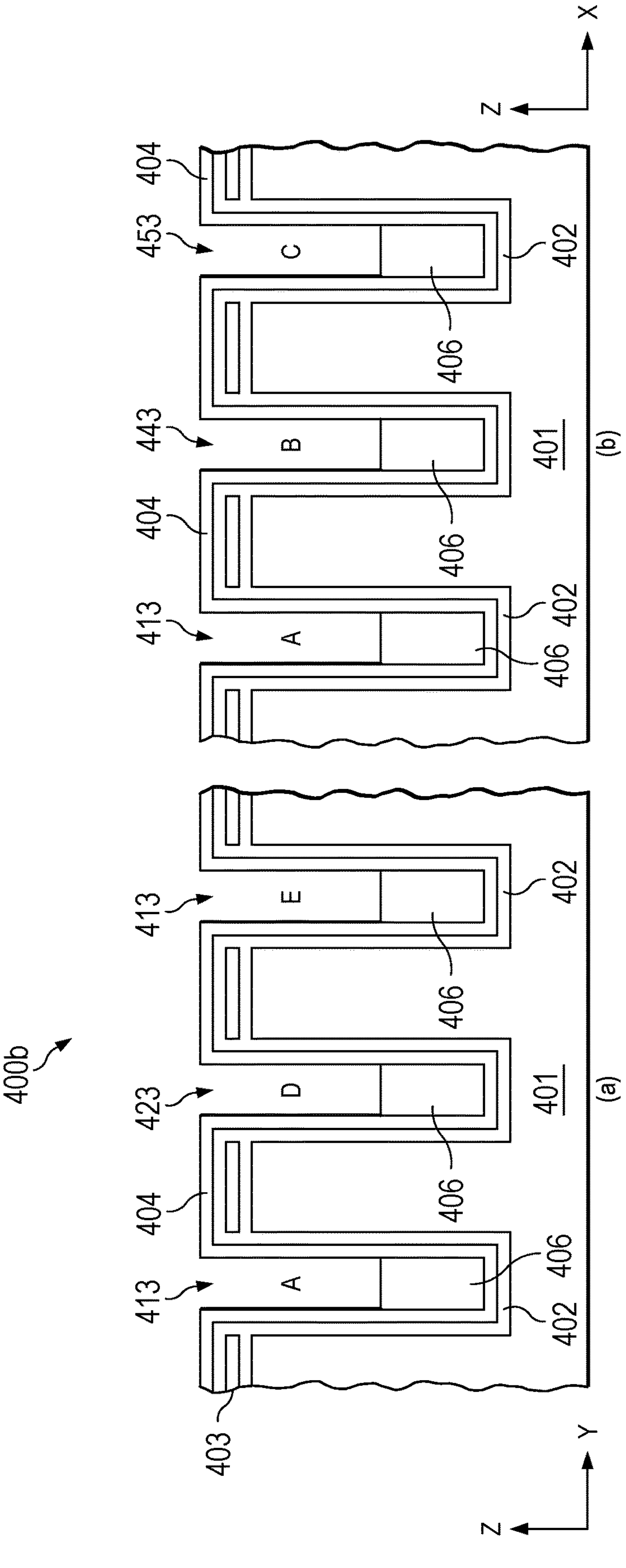
Figure 4C:
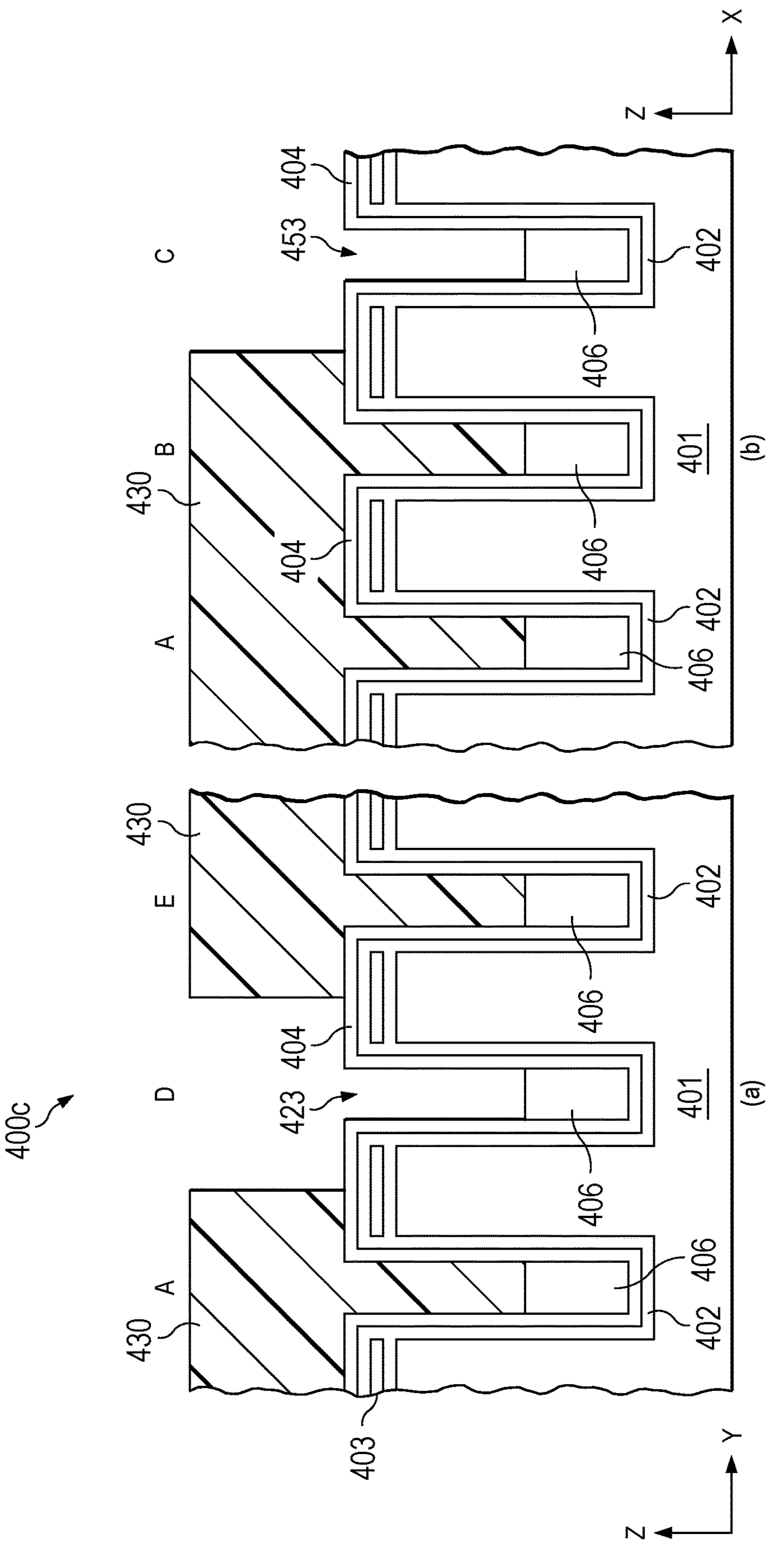
Figure 4D:
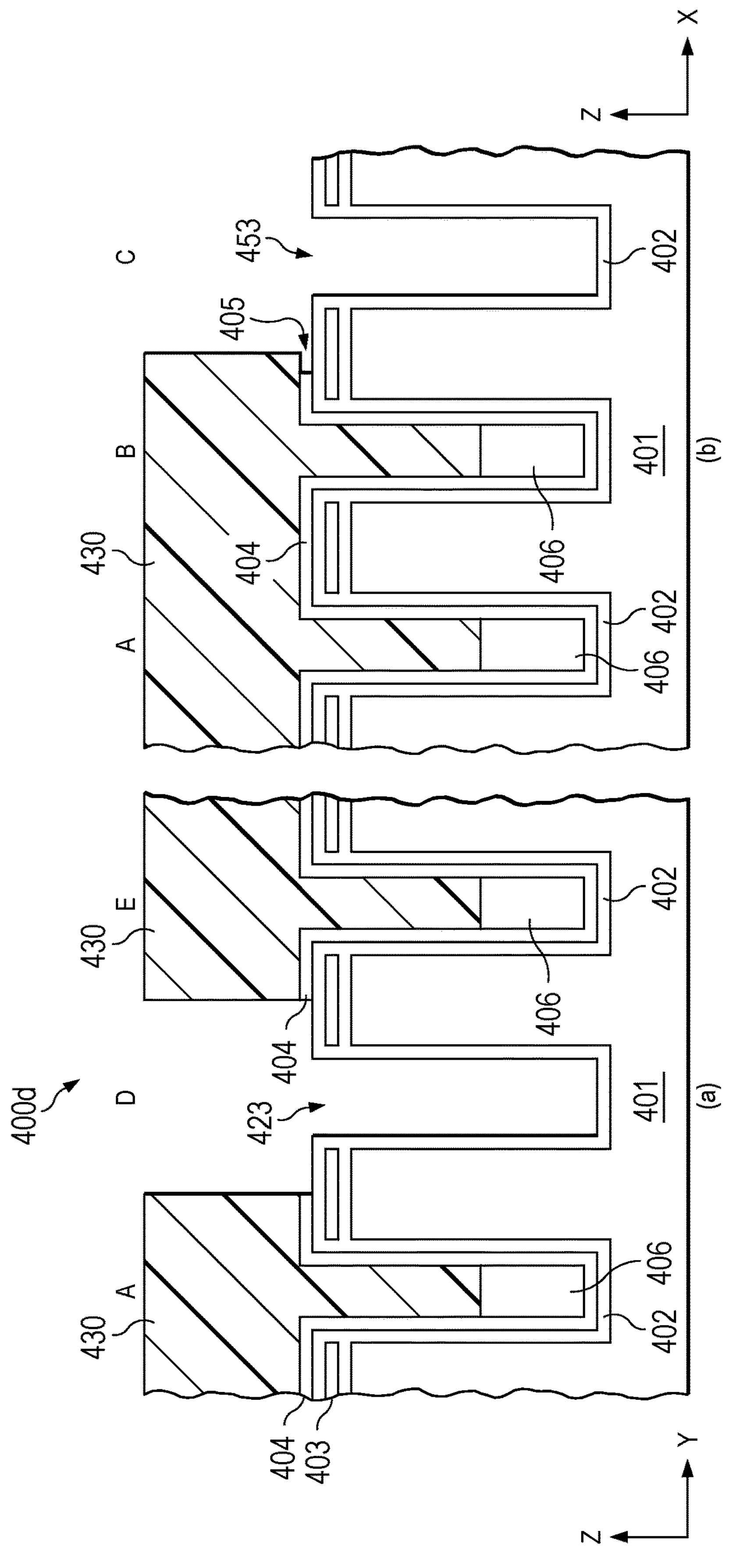
Figure 4E:
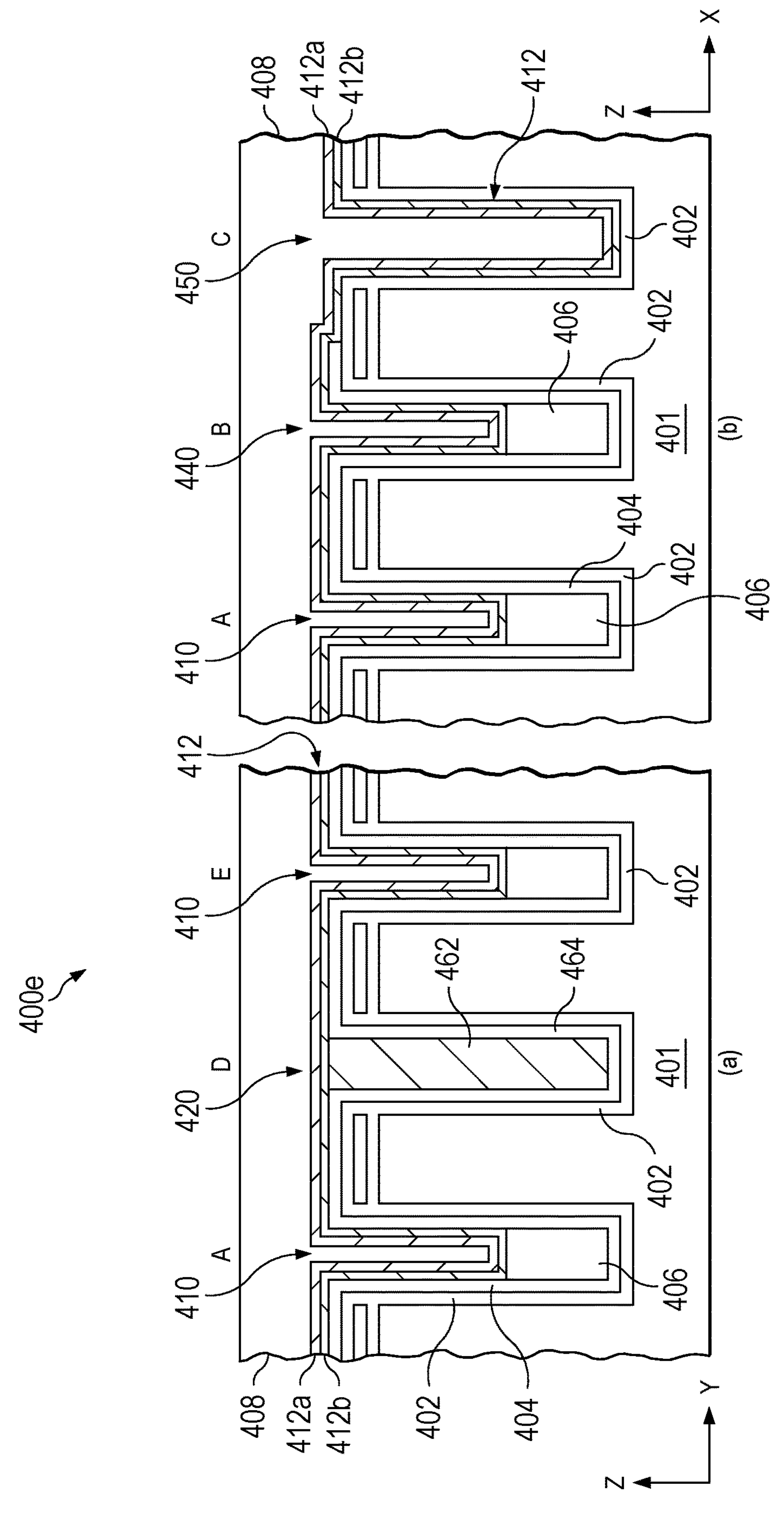
Figure 5:
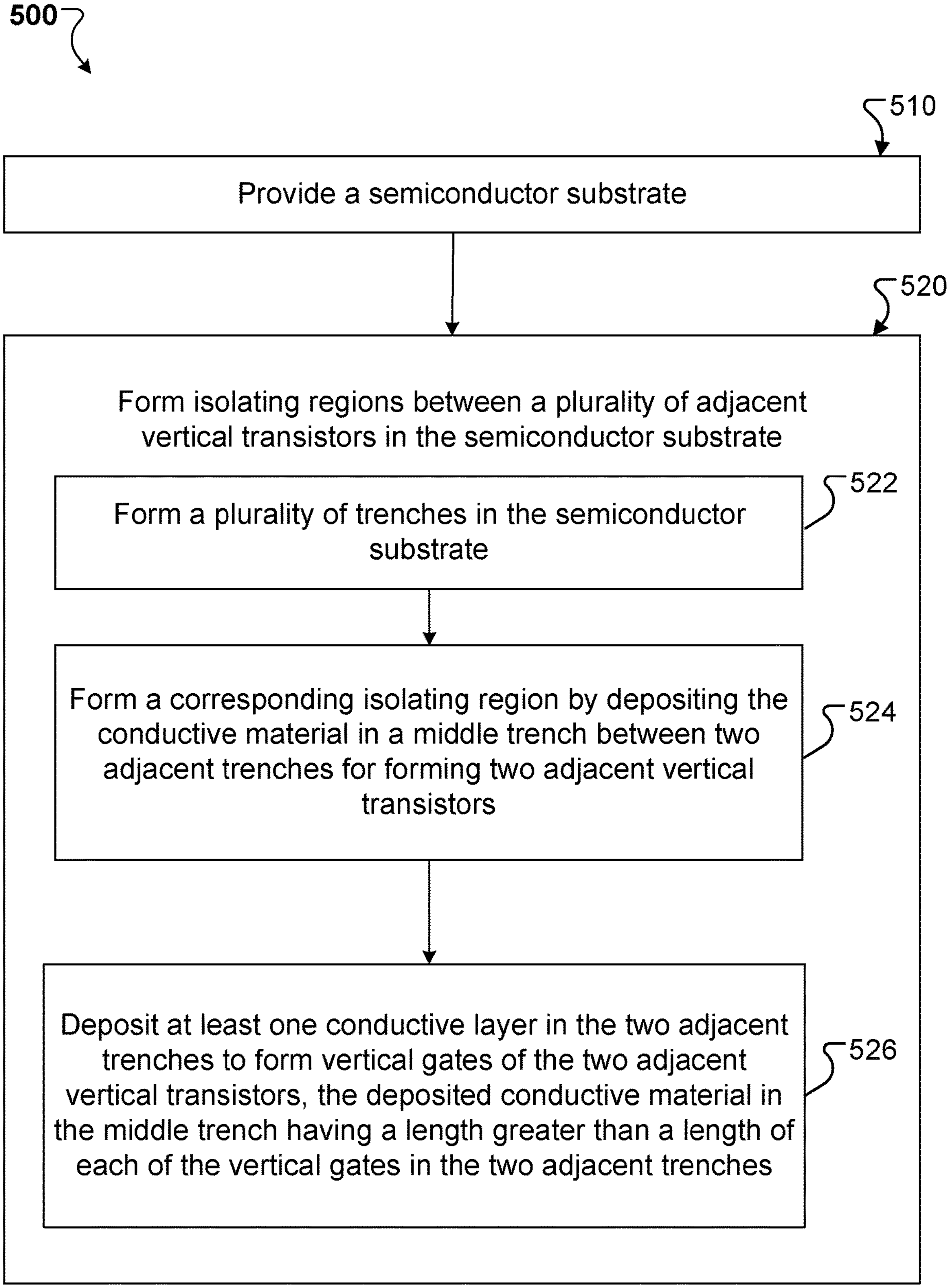
FIG. 5 is a flow chart of an example process of forming a 3D semiconductor device.

FIG. 5 is a flow chart of an example process 500 of forming a 3D semiconductor device. The 3D semiconductor device can be similar to, or same as, the 3D semiconductor device 100 of FIG. 1, or a part of the 3D semiconductor device 100 (e.g., the second semiconductor structure 104 of FIG. 1), or a structure at an intermediate fabrication process of the 3D semiconductor device 100 of FIG. 1, or the 3D semiconductor device 200 of FIGS. 2A-2B, or the 3D semiconductor structure 300 of FIGS. 3A-3E, or the 3D semiconductor structure 400*e* of FIG. 4E. The process 500 can be described in view of FIGS. 4A-4E. The process 500 can include the fabrication process of forming the 3D semiconductor structure in FIGS. 4A-4E. The process 500 includes operations (or steps) that can be performed with any suitable order and/or any combination. The terms "operation" and "step" can be used interchangeably to describe a process in the present disclosure.

At operation 510, a semiconductor substrate 401 is provided. The semiconductor substrate 401 can be similar to, or same as, the semiconductor substrate 301 of FIGS. 3A-3E. The semiconductor substrate 401 can include silicon (e.g., single crystalline silicon, c-Si), SiGe, GaAs, Ge, SOI, or any other suitable materials.

At operation 520, isolating regions 420 are formed between a plurality of adjacent vertical transistors in the semiconductor substrate. The isolating regions 420 can be, e.g., the trench isolations 160 of FIG. 1, the isolating regions 220 of FIGS. 2A-2B, or the isolating regions 320 of FIGS. 3A-3E. The vertical transistors can be, e.g., the vertical transistors 126 of FIG. 1, or the vertical transistors 212, 214 of FIG. 2A. Each vertical transistor of the plurality of adjacent vertical transistors extends along a vertical direction (e.g., Z direction), and two adjacent vertical transistors and a corresponding isolating region between the two adjacent vertical transistors are positioned along a first lateral direction (e.g., Y direction) perpendicular to the vertical direction. The corresponding isolating region includes a conductive material (e.g., the conductive material 322 of FIGS. 3A-3E), and along the vertical direction. A length of the conductive material in the corresponding isolating region is greater than a length of a vertical gate of each of the two adjacent vertical transistors, e.g., as illustrated in FIGS. 3A-3E.

In some implementations, the operation 520 includes suboperations 522, 524, 526. At suboperation 522, a plurality of trenches (e.g., 413, 423, 443, 453 at positions A, B, C, D, E) are formed in the semiconductor substrate 401, e.g., as illustrated in FIG. 4A. The trenches 413, 423, 443, 453 can be similar to, or same as, the trenches 313, 323, 343, 353 of FIGS. 3A-3E, respectively. The trenches extend along the vertical direction. The trenches can have a same depth along the vertical direction (e.g., Z direction) and/or a same width along the first lateral direction (e.g., Y direction) and/or a same width along a second lateral direction (e.g., X direction). The semiconductor substrate 401 can have a front side and a back side, and the plurality of trenches can be formed from the front side of the semiconductor substrate 401. In some implementations, one or more layers (e.g., an isolating layer 402*a* and a dielectric layer 403) are deposited on a surface of the front side of the semiconductor substrate 401, and the deposited one or more layers are patterned and etched through to the semiconductor substrate 401 to form the trenches.

In some implementations, e.g., as shown in FIG. 4A, an isolating layer 402 (e.g., the isolating layer 302 of FIGS. 3A-3E) is conformally deposited on an inner surface of each of the trenches 413, 423, 443, 453. The isolating layer 402 can include an isolating material, e.g., oxide. A dielectric layer 404 (e.g., the dielectric layer 304 of FIGS. 3A-3E) is formed on the isolating layer 402 in and out of the trenches 413, 423, 443, 453. The dielectric layer 404 can include a dielectric material, e.g., SiN. Diagrams (a) and (b) show a trench structure 400*a* after the isolating layer 402 and the dielectric layer 404 are formed in the trenches 413, 423, 443, 453. The semiconductor substrate 401 can include a first region to form an array region (e.g., the first region 200*a* of FIG. 2B or 300*a* of FIGS. 3A-3E) and a second region to form a connection region (e.g., the second region 200*b* of FIG. 2B or 300*b* of FIGS. 3A-3E). The first section and the second region have a boundary line 405 (e.g., the boundary line 205 of FIG. 2B or 305 of FIGS. 3A-3E).

In some implementations, the process 500 further includes: depositing an isolating material 406 (e.g., oxide) to fill a portion of each of the trenches 413, 423, 443, 453 along the vertical direction. A formed structure 400*b* includes the deposited isolating material 406 in the portions of the trenches 413, 423, 443, 453, respectively, e.g., as illustrated in FIG. 4B. The deposited isolating material 406 can have a length (or thickness) along the vertical direction from a bottom of the trenches 413, 423, 443, 453. The length can be about tens of nm, e.g., in a range from 10 nm to 100 nm.

In some implementations, the process 500 further includes: patterning photoresist 430 to cover the two adjacent trenches 413 at positions A, E and to expose the middle trench 423 at position D along Y direction and to expose the trench 453 at position C in the first region and to cover the trenches 413, 443 at positions A, B in the second region along X direction. As illustrated in diagrams (a) and (b) of FIG. 4C, in a formed structure 400*c*, photoresist 430 is inserted in the trenches 413, 443 to fill the trenches 413, 443, and covers surfaces adjacent to the trenches 413, 443, while there is no photoresist 430 in the middle trench 423 in the second region and in the trench 453 in the first region.

In some implementations, the process 500 further includes: etching the deposited isolating material 406 in the middle trench 423 in the second region and in the trench 453 in the first region, e.g., by wet etching. The process 500 can further etch the deposited dielectric layer 404 in the middle trench 423 in the second region and in the trench 453 in the first region, e.g., by wet etching. Note that the isolating layer 402 is kept unetched in the trenches 423, 453. FIG. 4D shows a formed structure 400*d* after etching the structure 400*c* of FIG. 4C. It is shown that the deposited isolating material 406 and the deposited dielectric layer 404 in the trenches 423, 453 are etched away, while the deposited isolating material 406 and the deposited dielectric layer 404 in the trenches 413, 443 remain protected by the photoresist 430.

At operation 524, the corresponding isolating region 420 is formed by depositing a conductive material 462 in the middle trench 423 between the two adjacent trenches 413. As shown in diagram (a) of FIG. 4E, the conductive material 462 can be filled in the middle trench 423. In some implementations, before depositing the conductive material 462 in the middle trench 423, a dielectric layer 464 is first deposited on the isolating layer 402 in the middle trench 423. In some implementations, during depositing the dielectric layer 464 and the conductive material 462 in the middle trench 423, the trench 453 in the first region is protected from the deposition, e.g., by forming another photoresist in the first region. After forming the isolating region 420, the photoresist 430 is removed.

At operation 526, at least one conductive layer 412 is deposited on a formed structure, where the at least one conductive layer 412 can be conformally deposited on the dielectric layer 404 and on top of the deposited isolating material 406 in the trenches 413, 443, the at least one conductive layer 412 can be also deposited on the isolating region 420, and the at least one conductive layer 412 can be conformally deposited on the isolating layer 402 in the trench 453 in the first region. The at least one conductive layer 412 can be similar to, or same as, the at least one conductive layer 312 of FIGS. 3A-3E. In some implementations, the at least one conductive layer 412 includes an intermediate layer 412*a* (e.g., the intermediate layer 312*a* of FIGS. 3A-3E) and a metallic layer 412*b* (e.g., the metallic layer 312*b* of FIGS. 3A-3E). In some implementations, before depositing the at least one conductive layer 412, a high-K dielectric layer can be first deposited on the isolating layer 402 in the trench 453 and on the dielectric layer 404 in the trenches 413, 443.

In some implementations, the process 500 further includes: depositing an isolating layer 408 on the at least one conductive layer 412. FIG. 4E shows a formed structure 400*e* after the isolating layer 408 is deposited. The structure 400*e* can be same as the 3D semiconductor structure 300 of FIGS. 3A-3E. For example, diagram (a) of FIG. 4E can be same as diagram (b) of FIG. 3A, and diagram (b) of FIG. 4E can be same as FIG. 3E. The structure 400*e* can include trench structures 410 (e.g., the trench structures 310 of FIGS. 3A-3E) at positions A and E, the isolating region 420 (e.g., the isolating region 320 of FIGS. 3A-3E) at position D, the trench structure 440 (e.g., the trench structure 340 of FIGS. 3A-3E) at position B, and the trench structure 450 (e.g., the trench structure 350 of FIGS. 3A-3E).

As noted above, along the vertical direction, a length of the deposited at least one conductive layer 412 in the adjacent trenches 413 is smaller than a length of the conductive material 462 filled in the middle trench 423, e.g., as illustrated in diagram (a) of FIG. 4E. The length of the deposited at least one conductive layer 412 in the trenches 413, 443 in the second region is also smaller than a length of the at least one conductive layer 412 in the trench 453 in the first region, e.g., as illustrated in diagram (b) of FIG. 4E.

In some implementations, as noted above, along the vertical direction, as there is the dielectric layer 404 in the trench 443 and there is no dielectric layer 404 in the trench 453, a surface of the at least one conductive layer 412 adjacent to the trench 453 can be lower than a surface of the at least one conductive layer 412 adjacent to the trench 443, e.g., as illustrated in diagram (b) of FIG. 4E.

In some implementations, the process 500 further includes: for each of the trench structures 410, 440, 450, cutting the deposited at least one conductive layer 412 in the trench 413, 443, 453 to form two separate vertical gates (e.g., the gate electrodes 134 of FIG. 1) of a pair of independent vertical transistors in the trench 413, 443, 453, e.g., as illustrated in FIG. 2B. The vertical gates can be coupled to a word line or be a part of a word line (e.g., the word line 230*a*, 230*b* of FIG. 2B). Accordingly, each of the vertical gates in the trench 413, 443 in the second region has a length smaller than a length of the conductive material 462 in the isolating region 420, and smaller than a length of the vertical gate in the trench 453 in the first region.

In some implementations, the process 500 further includes: etching the semiconductor substrate 401 from the back side of the semiconductor substrate 401 to expose the conductive material 462 in the corresponding isolating region 420, without exposing the vertical gates (or the deposited at least one conductive layer 412) of the two adjacent vertical transistors in the adjacent trench structures 410, e.g., as illustrated in FIG. 3C. In some implementations, the semiconductor substrate is etched in an etching region, e.g., the etching region 330 of FIG. 3C, from a surface (e.g., z1 in FIG. 3C) of the semiconductor substrate 401 along the vertical direction. The etching region has a bottom edge (e.g., z2 in FIG. 3CA) and an etching depth (e.g., d in FIG. 3C) from the surface of the semiconductor substrate to the bottom edge. Along the vertical direction, the etching depth is greater than a first distance between the surface of the semiconductor substrate 401 and an end (e.g., 322*z* in FIG. 3C) of the conductive material filled in the middle trench 423 and smaller than a second distance between the surface of the semiconductor substrate and an end (e.g., 312*z* in FIG. 3C) of the deposited at least one conductive layer in each of the two adjacent trenches 413. In some implementations, the etching region has two opposite edges (e.g., Y1, Y2 in FIG. 3C) within the two adjacent trenches along the horizontal direction.

In some implementations, the process 500 further includes: forming a corresponding conductive interconnection (e.g., the conductive interconnection 240 of FIG. 2B) in contact with the exposed conductive material 462 in the corresponding isolating region 420 in the back side of the semiconductor substrate 401. In some implementations, the process 500 further includes: forming a plurality of bit lines (e.g., the bit line 123 of FIG. 1 or 202 of FIGS. 2A-2B) on the back side of the semiconductor substrate 401.

In some implementations, the process 500 includes: forming an array structure in the first region. The array structure can include a plurality of strings of memory cells (e.g., the memory cells 124 of FIG. 1). Each memory cell includes a respective vertical transistor (e.g., the vertical transistor 126 of FIG. 1 or 212, 214 of FIG. 2A). The isolating regions 420 and the trench structures 410, 440 are formed in the second region adjacent to the first region.

Figure 6:
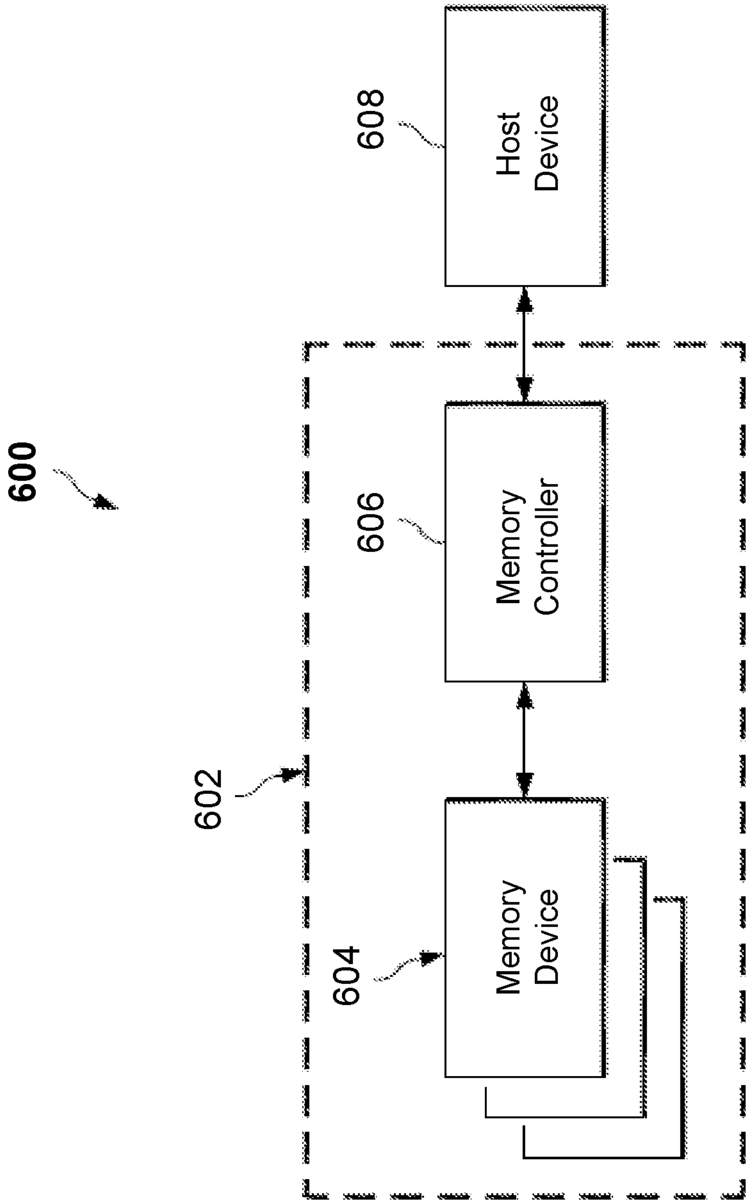
FIG. 6 illustrates a block diagram of an example system having one or more semiconductor devices.

FIG. 6 illustrates a block diagram of a system 600 having one or more semiconductor devices (e.g., memory devices), according to one or more implementations of the present disclosure. The system 600 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 6, the system 600 can include a host device 608 and a memory system 602 having one or more 3D memory devices 604 and a memory controller 606. Host device 608 can include a processor of an electronic device, such as a central processing unit (CPU), or a system-on-chip (SoC), such as an application processor (AP). Host device 608 can be configured to send or receive data to or from the one or more 3D memory devices 604.

A 3D memory device 604 can be any 3D memory device disclosed herein, such as 3D memory device depicted in FIG. 1, FIGS. 2A-2B, or 3D memory device based on the 3D semiconductor structure 300 of FIGS. 3A-3B. In some implementations, a 3D memory device 604 includes a NAND Flash memory. Memory controller 606 (a.k.a., a controller circuit) is coupled to 3D memory device 604 and host device 608. Consistent with implementations of the present disclosure, 3D memory device 604 can include a plurality of conductive interconnections through a cover layer that are in contact with conductive pads in a conductive pad layer, and memory controller 606 can be coupled to 3D memory device 604 through at least one of the plurality of conductive interconnections. Memory controller 606 is configured to control 3D memory device 604. For example, memory controller 606 may be configured to operate a plurality of channel structures via word lines. Memory controller 606 can manage data stored in 3D memory device 604 and communicate with host device 608.

In some implementations, memory controller 606 is designed/configured for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 606 is designed/configured for operating in a high duty cycle environment SSDs or embedded multi-media-cards (eMMCs) used as data storage for mobile devices, such as smartphones, tablets, laptop computers, etc., and enterprise storage arrays. Memory controller 606 can be configured to control operations of 3D memory device 604, such as read, erase, and program (or write) operations. Memory controller 606 can also be configured to manage various functions with respect to the data stored or to be stored in 3D memory device 604 including, but not limited to bad-block management, garbage collection, logical-to-physical address conversion, wear leveling, etc. In some implementations, memory controller 606 is further configured to process error correction codes (ECCs) with respect to the data read from or written to 3D memory device 604. Any other suitable functions may be performed by memory controller 606 as well, for example, formatting 3D memory device 604.

Memory controller 606 can communicate with an external device (e.g., host device 608) according to a particular communication protocol. For example, memory controller 606 may communicate with the external device through at least one of various interface protocols, such as a USB protocol, an MMC protocol, a peripheral component interconnection (PCI) protocol, a PCIexpress (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 606 and one or more 3D memory devices 604 can be integrated into various types of storage devices, for example, be included in the same package, such as a universal Flash storage (UFS) package or an eMMC package. That is, memory system 602 can be implemented and packaged into different types of end electronic products. In one example as shown in FIG. 6, memory controller 606 and a single 3D memory device 604 may be integrated into a memory card 602. Memory card 602 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc.

Implementations of the subject matter and the actions and operations described in this present disclosure can be implemented in digital electronic circuitry, in tangibly-embodied computer software or firmware, in computer hardware, including the structures disclosed in this present disclosure and their structural equivalents, or in combinations of one or more of them. Implementations of the subject matter described in this present disclosure can be implemented as one or more computer programs, e.g., one or more modules of computer program instructions, encoded on a computer program carrier, for execution by, or to control the operation of, data processing apparatus. The carrier may be a tangible non-transitory computer storage medium. Alternatively, or in addition, the carrier may be an artificially-generated propagated signal, e.g., a machine-generated electrical, optical, or electromagnetic signal, that is generated to encode information for transmission to suitable receiver apparatus for execution by a data processing apparatus. The computer storage medium can be or be part of a machine-readable storage device, a machine-readable storage substrate, a random or serial access memory device, or a combination of one or more of them. A computer storage medium is not a propagated signal.

It is noted that references in the present disclosure to "one embodiment," "an embodiment," "an example embodiment," "some implementations," "some implementations," etc., indicate that the implementation described can include a particular feature, structure, or characteristic, but every implementation can not necessarily include the particular feature, structure, or characteristic. Moreover, such phrases do not necessarily refer to the same implementation. Further, when a particular feature, structure or characteristic is described in connection with an implementation, it would be within the knowledge of a person skilled in the pertinent art to affect such feature, structure or characteristic in connection with other implementations whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for case of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically noN+ conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

As used herein, the term "nominal/nominally" refers to a desired, or target, value of a characteristic or parameter for a component or a process step, set during the design phase of a product or a process, together with a range of values above and/or below the desired value. As used herein, the range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., +−10%, +−20%, or +−30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

The present disclosure provides many different implementations, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include implementations in which the first and second features may be in direct contact, and may also include implementations in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various implementations and/or configurations discussed.

The foregoing description of the specific implementations can be readily modified and/or adapted for various applications. Therefore, such adaptations and modifications are intended to be within the meaning and range of equivalents of the disclosed implementations, based on the teaching and guidance presented herein.

While the present disclosure contains many specific implementation details, these should not be construed as limitations on the scope of what is being claimed, which is defined by the claims themselves, but rather as descriptions of features that may be specific to particular implementations. Certain features that are described in this present disclosure in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially be claimed as such, one or more features from a claimed combination can in some cases be excised from the combination, and the claim may be directed to a sub-combination or variation of a sub-combination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations also are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

The breadth and scope of the present disclosure should not be limited by any of the above-described exemplary implementations, but should be defined only in accordance with the following claims and their equivalents.

What is claimed is:

1. A method comprising:

providing a semiconductor substrate; and forming isolating regions between a plurality of adjacent vertical transistors in the semiconductor substrate, wherein each vertical transistor of the plurality of adjacent vertical transistors extends along a vertical direction, and wherein two adjacent vertical transistors and a corresponding isolating region between the two adjacent vertical transistors are positioned along a horizontal direction perpendicular to the vertical direction, wherein the corresponding isolating region comprises a conductive material, and wherein, along the vertical direction, a length of the conductive material in the corresponding isolating region is greater than a length of a vertical gate of each of the two adjacent vertical transistors, and wherein, along the vertical direction, the length of the conductive material is defined by a distance between a first surface and a second surface of the corresponding isolating region, and the length of the vertical gate is defined by a distance between a third surface and a fourth surface of the vertical gate, and wherein the first surface and the third surface are coplanar.

2. The method of claim 1, wherein forming the isolating regions between the plurality of adjacent vertical transistors in the semiconductor substrate comprises:

forming a plurality of trenches in the semiconductor substrate, the plurality of trenches being positioned along the horizontal direction, each of the plurality of trenches extending along the vertical direction; and forming the corresponding isolating region by depositing the conductive material in a middle trench between two adjacent trenches for forming the two adjacent vertical transistors.

3. The method of claim 2, further comprising:

forming the two adjacent vertical transistors by depositing an isolating material in the two adjacent trenches and then depositing at least one conductive layer on the deposited isolating material in the two adjacent trenches to form the vertical gates of the two adjacent vertical transistors, wherein, along the vertical direction, a length of the deposited at least one conductive layer in each of the two adjacent trenches is smaller than the length of the conductive material filled in the middle trench.

4. The method of claim 3, wherein the semiconductor substrate comprises a first side and a second side opposite to the first side, wherein forming the isolating regions between the adjacent vertical transistors in the semiconductor substrate comprises forming the isolating regions between the adjacent vertical transistors in the semiconductor substrate from the first side of the semiconductor substrate, and wherein the method further comprises:

etching the semiconductor substrate from the second side of the semiconductor substrate to expose the conductive material in the corresponding isolating region, without exposing the vertical gates of the two adjacent vertical transistors.

5. The method of claim 4, wherein etching the semiconductor substrate from the second side of the semiconductor substrate comprises:

etching the semiconductor substrate in an etching region from a surface of the semiconductor substrate along the vertical direction, wherein the etching region has a bottom edge and an etching depth from the surface of the semiconductor substrate to the bottom edge, and wherein, along the vertical direction, the etching depth is greater than a first distance between the surface of the semiconductor substrate and an end of the conductive material filled in the middle trench and smaller than a second distance between the surface of the semiconductor substrate and an end of the deposited at least one conductive layer in each of the two adjacent trenches.

6. The method of claim 4, further comprising:

forming a corresponding conductive interconnection in contact with the exposed conductive material in the corresponding isolating region in the second side of the semiconductor substrate.

7. The method of claim 4, further comprising:

forming a plurality of bit lines from the second side of the semiconductor substrate.

8. The method of claim 3, wherein the method comprises:

depositing the isolating material to fill a portion of each of the plurality of trenches along the vertical direction;

patterning photoresist to cover the two adjacent trenches and to expose the middle trench;

etching the deposited isolating material in the middle trench;

depositing the conductive material in the middle trench to form the corresponding isolating region; and removing the photoresist and depositing the at least one conductive layer on the deposited isolating material in the two adjacent trenches to form the vertical gates of the two adjacent vertical transistors.

9. The method of claim 3, wherein the method comprises:

for each of the two adjacent trenches, cutting the deposited at least one conductive layer in the trench to form two separate vertical gates of a pair of independent vertical transistors in the trench.

10. The method of claim 3, further comprising:

forming an array structure in a first region, the array structure comprising a plurality of strings of memory cells, each memory cell of the plurality of strings of memory cells comprising a respective vertical transistor, wherein the isolating regions and the plurality of adjacent vertical transistors in the semiconductor substrate are formed in a second region adjacent to the first region.

11. The method of claim 10, wherein forming the array structure comprises:

forming the respective vertical transistors of the plurality of strings of memory cells by depositing the at least one conductive layer in corresponding trenches, wherein, along the vertical direction, a length of the deposited at least one conductive layer in the corresponding trenches in the first region is greater than the length of the vertical gate of each of the two adjacent vertical transistors in the second region.

12. The method of claim 11, wherein the method comprises:

depositing the isolating material to fill a portion of each of the two adjacent trenches for the two adjacent vertical transistors in the second region and the corresponding trenches for the memory cells in the first region along the vertical direction;

patterning photoresist to cover the two adjacent trenches and to expose the corresponding trenches;

etching the deposited isolating material in the corresponding trenches;

removing the photoresist to expose the two adjacent trenches; and depositing the at least one conductive layer on the deposited isolating material in the two adjacent trenches to form the vertical gates of the two adjacent vertical transistors and in the corresponding trenches to form the vertical transistors for the memory cells.

13. A semiconductor device, comprising:

a semiconductor substrate;

a plurality of vertical transistors positioned in the semiconductor substrate along a horizontal direction, each of the plurality of vertical transistors extending along a vertical direction perpendicular to the horizontal direction; and a plurality of isolating regions in the semiconductor substrate, each of the plurality of isolating regions being between two adjacent vertical transistors of the plurality of vertical transistors along the horizontal direction, wherein the isolating region comprises a conductive material, and wherein, along the vertical direction, a length of the conductive material in the isolating region is greater than a length of a vertical gate of each of the two adjacent vertical transistors, and wherein, along the vertical direction, the length of the conductive material is defined by a distance between a first surface and a second surface of the corresponding isolating region, and the length of the vertical gate is defined by a distance between a third surface and a fourth surface of the vertical gate, and wherein the first surface and the third surface are coplanar.

14. The semiconductor device of claim 13, wherein the isolating region comprises the conductive material filled in a middle trench between two adjacent trenches corresponding to the two adjacent vertical transistors, wherein the vertical gate of each of the two adjacent vertical transistors comprises at least one conductive layer on an isolating material filled in a portion of a respective trench of the two adjacent trenches, and wherein, along the vertical direction, a length of the at least one conductive layer in each of the two adjacent trenches is smaller than the length of the conductive material filled in the middle trench.

15. The semiconductor device of claim 14, wherein the semiconductor substrate comprises a first side and a second side opposite to the first side, wherein the plurality of isolating regions and the plurality of vertical transistors are in the first side of the semiconductor substrate, and wherein the semiconductor device further comprises:

conductive interconnections formed in the second side of the semiconductor substrate, wherein each of the conductive interconnections is in contact with the conductive material in a corresponding isolating region of the plurality of isolating regions and has an end higher than an end of the at least one conductive layer in each of the two adjacent trenches from the second side of the semiconductor substrate along the vertical direction.

16. The semiconductor device of claim 14, further comprising an array structure in a first region, the array structure comprising a plurality of strings of memory cells, each memory cell of the plurality of strings of memory cells comprising a vertical transistor having a vertical gate, wherein the plurality of isolating regions and the plurality of vertical transistors are formed in a second region of the semiconductor substrate that is adjacent to the first region along a third direction perpendicular to the vertical direction and the horizontal direction.

17. The semiconductor device of claim 16, wherein, along the vertical direction, a length of the vertical gate of the vertical transistor of the memory cell in the first region is greater than the length of the vertical gate of each of the two adjacent vertical transistors in the second region.

18. The semiconductor device of claim 16, wherein, along the third direction, the vertical gate of the vertical transistor of the memory cell in the first region is in direct contact with a first isolating layer, while the vertical gate of each of the two adjacent vertical transistors in the second region is separated from a second isolating layer by a passivation layer.

19. A system, comprising:

a memory device comprising:

a semiconductor substrate;

a plurality of vertical transistors positioned in the semiconductor substrate along a horizontal direction, each of the plurality of vertical transistors extending along a vertical direction perpendicular to the horizontal direction; and a plurality of isolating regions in the semiconductor substrate, each of the plurality of isolating regions being between two adjacent vertical transistors along the horizontal direction, wherein the isolating region comprises a conductive material, wherein, along the vertical direction, a length of the conductive material in the isolating region is greater than a length of a vertical gate of each of the two adjacent vertical transistors, and wherein, along the vertical direction, the length of the conductive material is defined by a distance between a first surface and a second surface of the corresponding isolating region, and the length of the vertical gate is defined by a distance between a third surface and a fourth surface of the vertical gate, and wherein the first surface and the third surface are coplanar; and a controller coupled to the memory device and configured to control the memory device.

20. The system of claim 19, wherein the isolating region comprises the conductive material filled in a middle trench between two adjacent trenches corresponding to the two adjacent vertical transistors, wherein the vertical gate of each of the two adjacent vertical transistors comprises at least one conductive layer on an isolating material filled in a portion of a respective trench of the two adjacent trenches, and wherein, along the vertical direction, a length of the at least one conductive layer in each of the two adjacent trenches is smaller than the length of the conductive material filled in the middle trench.

* * * * *